United States Patent
Lipton et al.

(10) Patent No.: US 6,505,323 B1
(45) Date of Patent: Jan. 7, 2003

(54) METHODS, APPARATUS AND COMPUTER PROGRAM PRODUCTS THAT PERFORM LAYOUT VERSUS SCHEMATIC COMPARISON OF INTEGRATED CIRCUIT MEMORY DEVICES USING BIT CELL DETECTION AND DEPTH FIRST SEARCHING TECHNIQUES

(75) Inventors: Gary Bruce Lipton, Durham, NC (US); Harry Clarkson Johnson, IV, Raleigh, NC (US); Jonathan Calvin White, Mebane, NC (US)

(73) Assignee: Avant! Corporation, Fremont, CA (US)

( * ) Notice: Subject to any disclaimer, the term of this patent is extended or adjusted under 35 U.S.C. 154(b) by 221 days.

(21) Appl. No.: 09/747,288

(22) Filed: Dec. 22, 2000

Related U.S. Application Data

(63) Continuation-in-part of application No. 09/505,499, filed on Feb. 17, 2000.

(51) Int. Cl.[7] ............................................. G06F 17/50
(52) U.S. Cl. ......................................................... 716/3
(58) Field of Search ....................................... 716/1–21

(56) References Cited

U.S. PATENT DOCUMENTS

| | | |
|---|---|---|
| 5,249,133 A | 9/1993 | Batra |
| 5,432,707 A | 7/1995 | Leung |
| 5,471,398 A | 11/1995 | Stephens |
| 5,629,859 A | 5/1997 | Agarwala et al. |
| 5,696,693 A | 12/1997 | Aubel et al. |
| 5,787,006 A | 7/1998 | Chevallier et al. |
| 5,790,416 A | 8/1998 | Norton et al. |
| 5,793,643 A | 8/1998 | Cai |
| 5,798,936 A | 8/1998 | Cheng |
| 5,841,664 A | 11/1998 | Cai et al. |
| 5,847,965 A | 12/1998 | Cheng |
| 5,903,469 A | 5/1999 | Ho |
| 5,930,499 A | 7/1999 | Chen et al. |
| 5,987,086 A | 11/1999 | Raman et al. |
| 6,009,250 A | 12/1999 | Ho et al. |
| 6,009,251 A | 12/1999 | Ho et al. |
| 6,009,252 A * | 12/1999 | Lipton ................... 395/500.06 |
| 6,011,911 A | 1/2000 | Ho et al. |
| 6,012,155 A | 1/2000 | Beausang et al. |
| 6,056,784 A | 5/2000 | Stanion |
| 6,115,546 A * | 9/2000 | Chevallier et al. ...... 395/500.06 |
| 6,336,206 B1 | 1/2002 | Lockyear |
| 6,453,449 B1 * | 9/2002 | Wada ............................ 716/5 |

\* cited by examiner

Primary Examiner—Matthew Smith
Assistant Examiner—Magid Y Dimyan
(74) Attorney, Agent, or Firm—Myers Bigel Sibley & Sajovec

(57) ABSTRACT

A layout versus schematic (LVS) comparison tool performs layout versus schematic comparison of integrated circuits having memory cells and non-memory cells therein. These operations are particularly useful when the integrated circuit layout includes one or more arrays of memory cells (i.e., bit cells) that are identified at a transistor level in the layout netlist. Such operations include scanning a layout netlist of the integrated circuit at the transistor level to identify a first device therein that has an identifiable characteristic associated with the plurality of memory cells relative to the plurality of non-memory cells. Upon detection of the identifiable characteristic, the layout netlist of a first memory cell containing the first device is traced in order to identify a first bit line and/or a first word line therein that is electrically coupled to the first memory cell. This tracing operation preferably comprises tracing a netlist path extending from the first device to a first bit line or a first word line electrically connected to the first memory cell. This netlist path may include a path defined by one or more nets and devices connected together and preferably connected between the first device and the first bit line (or first word line). The first bit line and/or first word line is then traced locally to identify a plurality of additional memory cells electrically coupled thereto along a column or row. Additional bit lines and words lines that are connected to these identified memory cells can also be traced in a similar manner to identify a plurality of rows and columns of memory cells in a memory array block.

20 Claims, 30 Drawing Sheets

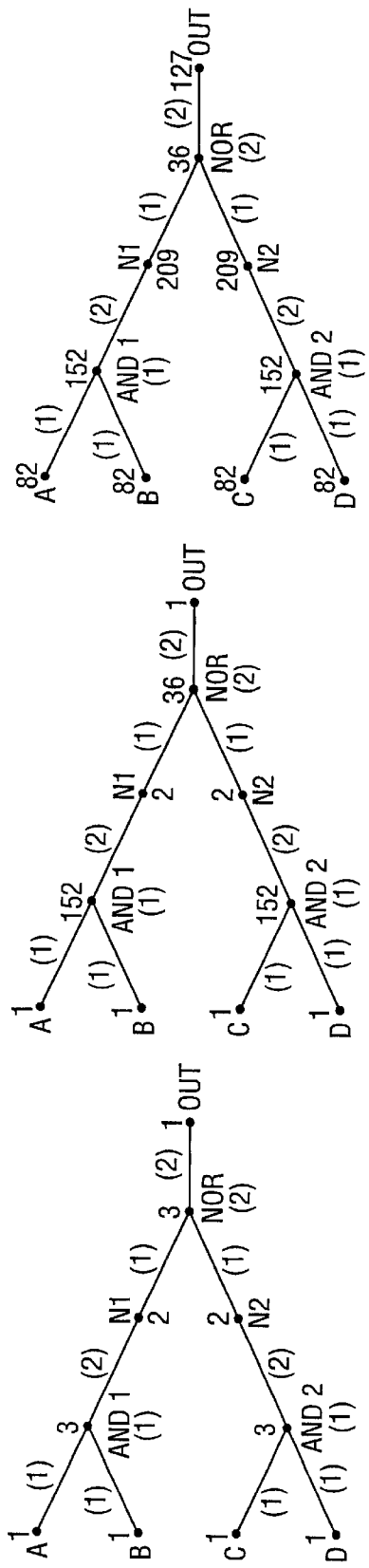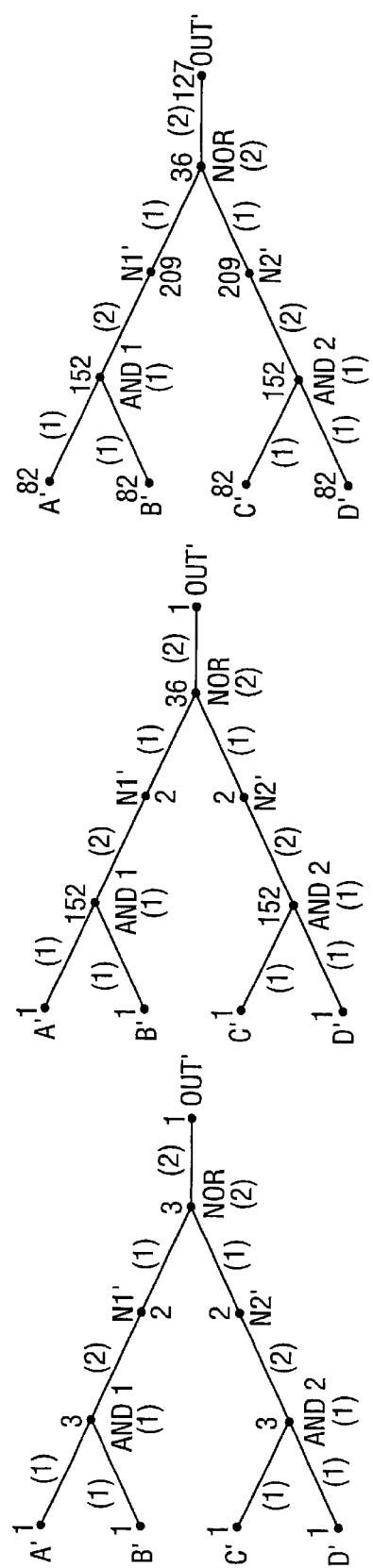

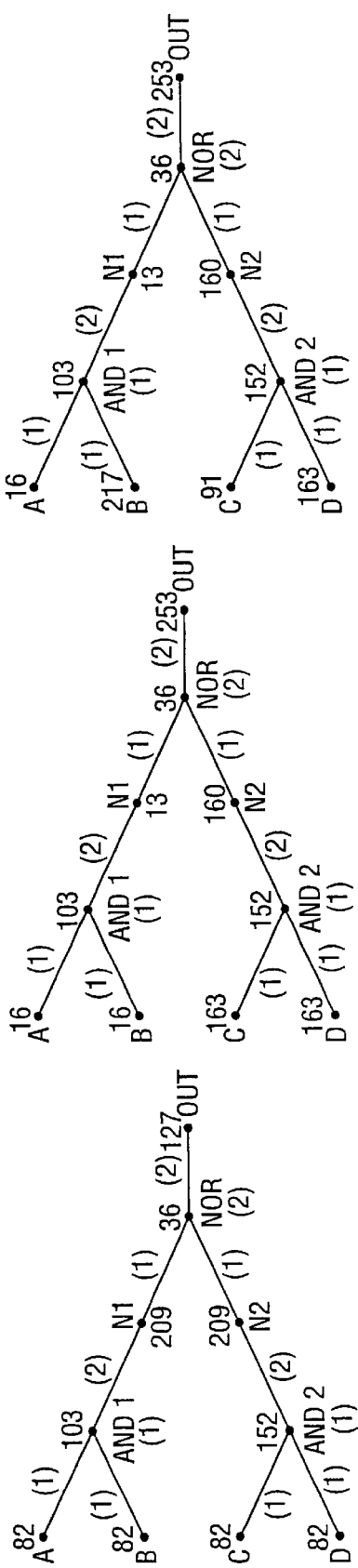
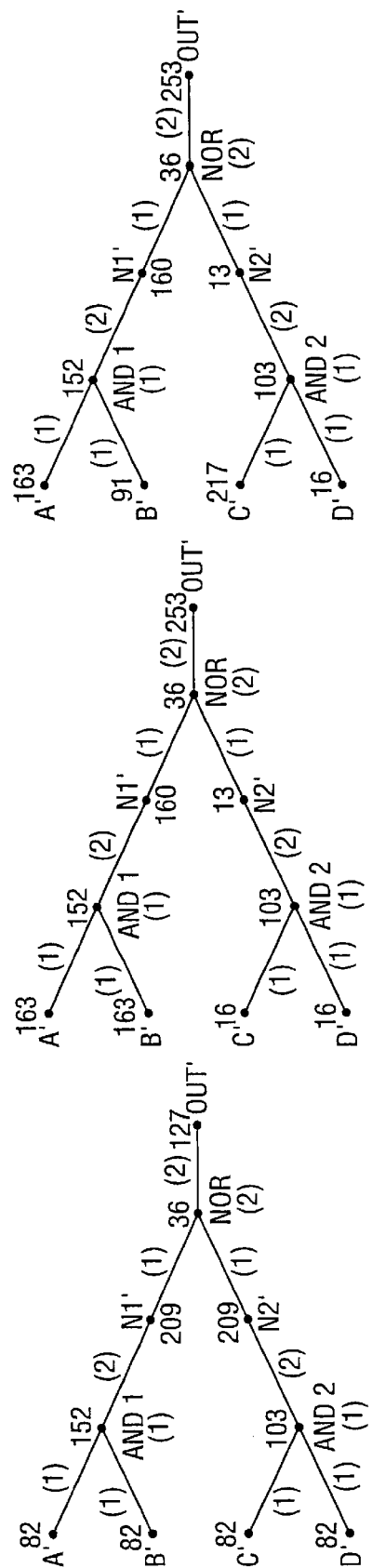
FIG. 13D (SCHEMATIC) ASSIGN
FIG. 13E (SCHEMATIC) PARTITION NETS
FIG. 13F (SCHEMATIC) ASSIGN
FIG. 14D (LAYOUT) ASSIGN
FIG. 14E (LAYOUT) PARTITION NETS
FIG. 14F (LAYOUT) ASSIGN

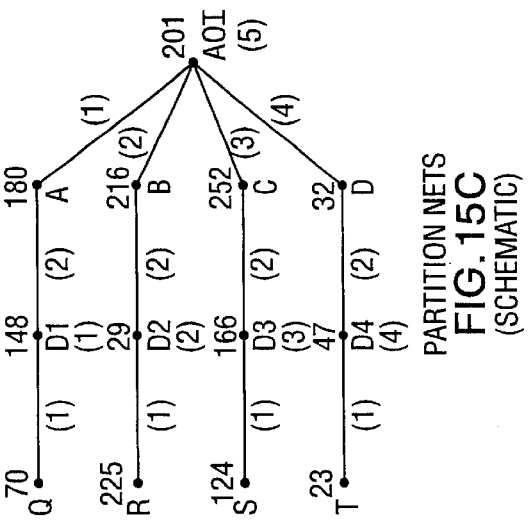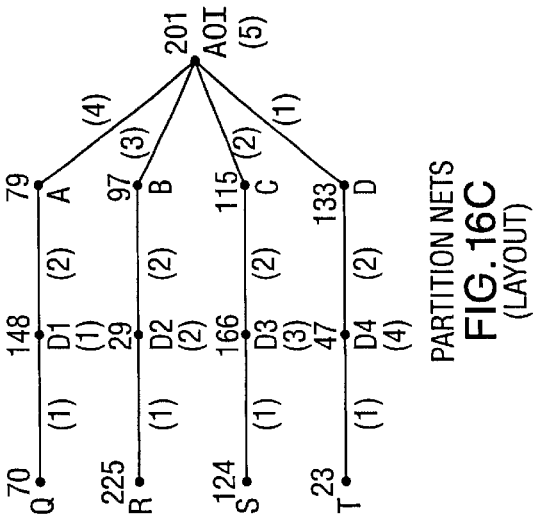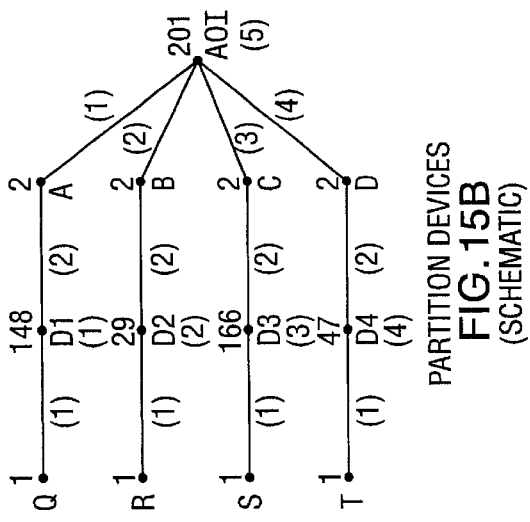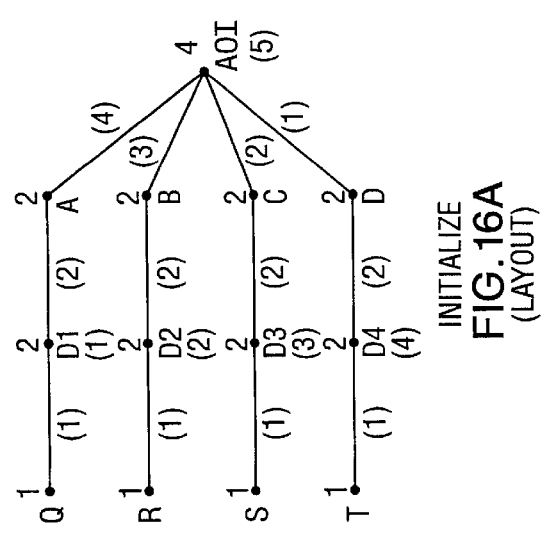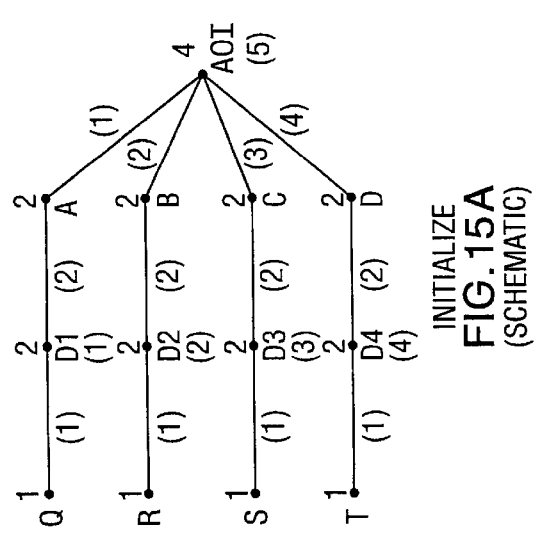

INITIALIZE (SCHEMATIC)

PARTITION DEVICES (SCHEMATIC)

INITIALIZE (CORRECT LAYOUT)

PARTITION DEVICES (CORRECT LAYOUT)

INITIALIZE (INCORRECT LAYOUT)

PARTITION DEVICES (INCORRECT LAYOUT)

PARTITION NETS (SCHEMATIC)

MULTIPLY BY CSM (SCHEMATIC)

PARTITION NETS (CORRECT LAYOUT)

MULTIPLY BY CSM (CORRECT LAYOUT)

PARTITION NETS (INCORRECT LAYOUT)

MULTIPLY BY CSM (INCORRECT LAYOUT)

|   |   | S | GL |
|---|---|---|---|
| INTERMEDIATE NET COLORS | N1<br>N2<br>N3<br>N4 | -6<br>-14<br>-8<br>-8 | -6<br>-14<br>-8<br>-8 |
| ASSIGN NEW COLOR (10) TO NET4 | N1<br>N2<br>N3<br>N4 | -6<br>-14<br>-8<br>10 | -6<br>-14<br>-8<br>10 |
| DETERMINE "COLORS" OF PINS | A<br>B<br>C<br>D<br>A<br>B<br>C<br>D | -6<br>-14<br>-8<br>10<br>10<br>-8<br>-14<br>-6 | -6<br>-14<br>-8<br>10<br>-6<br>-14<br>-8<br>10 |
| RECOLOR | A<br>B<br>C<br>D<br>A<br>B<br>C<br>D | 22<br>-2<br>-28<br>26<br>42<br>-48<br>10<br>50 | 22<br>-2<br>-28<br>26<br>50<br>10<br>-48<br>42 |
| DETERMINE FINAL NET COLORS | N1<br>N2<br>N3<br>N4 | 72<br>8<br>-76<br>68 | 72<br>8<br>-76<br>68 |

SCHEMATIC RECOLORING
A = -6-2(-14) = 22
B = -14-2(-6) = -2
C = -8-2(10) = -28
D = 10-2(-8) = 26
A = 10-4(8) = 42
B = -8-4(10) = -48
C = -14-4(-6) = 10
D = -6-4(-14) = 50

NET COLORS ARE UNIQUE AND COLOR VECTORS ARE IDENTICAL

FIG. 26-2

ASSIGN NEW COLOR (3) TO S2 AND L1

$$\begin{bmatrix}S1\\S2\\S3\\S4\end{bmatrix} \begin{matrix}S\\ \begin{bmatrix}7\\3\\-20\\-26\end{bmatrix}\end{matrix} \quad \begin{bmatrix}L1\\L2\\L3\\L4\end{bmatrix} \begin{matrix}GL\\ \begin{bmatrix}3\\-20\\7\\-26\end{bmatrix}\end{matrix}$$

DETERMINE "PIN" COLORS $$\begin{bmatrix}A\\B\\C\\D\\A\\B\\C\\D\end{bmatrix} \begin{matrix}S\\ \begin{bmatrix}7\\3\\-20\\-26\\-26\\7\\3\\-20\end{bmatrix}\end{matrix} \begin{matrix}GL\\ \begin{bmatrix}3\\-20\\7\\-26\\7\\3\\-20\\-26\end{bmatrix}\end{matrix}$$

RECOLOR PINS $$\begin{bmatrix}A\\B\\C\\D\\A\\B\\C\\D\end{bmatrix} \begin{matrix}S\\ \begin{bmatrix}-2\\-18\\58\\34\\-47\\85\\63\\-29\end{bmatrix}\end{matrix} \begin{matrix}GL\\ \begin{bmatrix}63\\-29\\85\\-47\\-2\\-18\\58\\34\end{bmatrix}\end{matrix}$$

GOOD LAYOUT RECOLORING
A = 3-3(-20)   = 63
B = -20-3(3)   = -29
C = 7-3(-26)   = 85
D = -26-3(7)   = -47
A = 7-3(3)    = -2
B = 3-3(7)    = -18
C = -20-3(-26) = 58
D = -26-3(-20) = 34

DETERMINE NEW NET COLORS $$\begin{bmatrix}S1\\S2\\S3\\S4\end{bmatrix} \begin{matrix}S\\ \begin{bmatrix}7\\3\\29\\-13\end{bmatrix}\end{matrix} \quad \begin{bmatrix}L1\\L2\\L3\\L4\end{bmatrix} \begin{matrix}GL\\ \begin{bmatrix}3\\29\\7\\-13\end{bmatrix}\end{matrix}$$

GOOD LAYOUT CONFIRMED

DETERMINE NEW DISTINCT DEVICE VALUES FOR SCHEMATIC AND LAYOUT

SDV1 = 3+ (-2)(-18)(58)(34)  = 70,995
SDV2 = 3+ (-47)(85)(63)(-29) = 7,298,868
LDV1 = 3+ (63)(-29)(85)(-47) = 7,298,868
LDV2 = 3+ (-2)(-18)(58)(34)  = 70,995

FIG. 27-2

|  | S | GL |
|---|---|---|
| INTERMEDIATE NET COLORS | N1: -6, N2: -14, N3: -8, N4: -8 | N1: -6, N2: -14, N3: -8, N4: -8 |
| ASSIGN NEW COLOR (10) TO NET4 | N1: -6, N2: -14, N3: -8, N4: 10 | N1: -6, N2: -14, N3: -8, N4: 10 |
| DETERMINE "COLORS" OF PINS | A: -6, B: -14, C: -8, D: 10, A: 10, B: -8, C: -14, D: -6 | A: -6, B: -14, C: -8, D: 10, A: -6, B: -14, C: -8, D: 10 |
| RECOLOR | A: 22, B: -2, C: -28, D: 26, A: 42, B: -48, C: 10, D: 60 | A: 22, B: -2, C: -28, D: 26, A: 50, B: 10, C: -46, D: 42 |
| DETERMINE FINAL NET COLORS | N1: 72, N2: 8, N3: -76, N4: 68 | N1: 72, N2: 8, N3: -76, N4: 68 |

FIG. 34-2.

SCHEMATIC RECOLORING

A = -6-2(-14)=22
B = -14-2(-6)=-2
C = -8-2(10)=-28
D = 10-2(-8)=26
A = 10-4(8)=42
B = -8-4(10)=-48
C = -14-4(-6)=10
D = -6-4(-14)=50

NET COLORS ARE UNIQUE AND COLOR VECTORS ARE IDENTICAL

METHODS, APPARATUS AND COMPUTER PROGRAM PRODUCTS THAT PERFORM LAYOUT VERSUS SCHEMATIC COMPARISON OF INTEGRATED CIRCUIT MEMORY DEVICES USING BIT CELL DETECTION AND DEPTH FIRST SEARCHING TECHNIQUES

CROSS-REFERENCE TO RELATED APPLICATION

This application is a continuation-in-part (CIP) of U.S. application Ser. No. 09/505,499, filed Feb. 17, 2000, assigned to the present assignee, the disclosure of which is hereby incorporated herein by reference.

FIELD OF THE INVENTION

This invention relates to the design, layout, testing and manufacture of microelectronic circuits and systems, and more particularly to apparatus and methods for verifying microelectronic circuits and systems prior to manufacture.

BACKGROUND OF THE INVENTION

Present day ultra-large-scale integration (ULSI) circuits may include hundreds of thousands or millions of interconnected active electronic devices on an integrated circuit chip. The large capital investment required to fabricate and test large scale integrated circuits prior to sale to a customer and the difficulty, expense and loss of goodwill associated with reworking and replacing integrated circuits which fail to operate as planned, have increased the need to accurately characterize the electrical behavior of integrated circuits prior to their manufacture.

Moreover, now that submicron and deep-submicron (0.5 $\mu$m and below) technologies have begun to dominate silicon chip manufacturing and the prospect of million-plus-gate chips operating at clock rates of 100 MHZ has become a reality, fundamental changes have had to be made to conventional integrated circuit design methodologies and the electronic design automation (EDA) tools based thereon. To meet the challenges posed by such large-scale circuits, techniques have been developed to represent integrated circuit designs at various levels of abstraction. According to these techniques, an integrated circuit design may be represented by an electrical schematic containing devices and nets interconnecting the devices and by geometric layout data that describes patterns of regions or elements to be formed in and/or on an integrated circuit substrate (e.g., wafer).

Techniques for managing highly integrated circuit designs include hierarchical design techniques. Using such techniques, a particular design is partitioned into functional cells and cells-within-cells, etc., so that at a given level of hierarchy the design may be analyzed as a set of cells and their respective interconnections, without being concerned with all the details of the contents of the cells (e.g., subcells within each cell).

These hierarchical techniques can be essential to the efficient performance of computer-assisted integrated circuit design verification. Such verification may include operations to perform layout versus schematic comparison (LVS) using computer-based design tools. As will be understood by those skilled in the art, tools to perform layout versus schematic comparison may include extraction software to extract a layout netlist from geometric layout data. An extracted layout netlist is then compared to an electrical schematic netlist to determine functional equivalence between the original integrated circuit schematic and the integrated circuit layout. One difficulty associated with the performance of these operations may be caused by a dissimilarity in the labeling of nets and devices in the extracted layout netlist relative to the electrical schematic netlist.

Conventional methods for determining correspondence between an electrical schematic netlist and a layout netlist are described in U.S. Pat. Nos. 5,249,133 to Batra entitled "Method for the Hierarchical Comparison of Schematics and Layouts of Electronic Components"; U.S. Pat. No. 5,463,561 to Razdan entitled "High Capacity Netlist Comparison"; and U.S. Pat. No. 5,243,538 to Okuzawa et al. entitled "Comparison and Verification System for Logic Circuits and Method Thereof." Another conventional method for determining correspondence includes operations to represent the electrical schematic netlist and the layout netlist as a schematic graph and a layout graph, respectively. Each of these graphs may be represented as bipartite graphs having vertices (also referred to herein as "nodes") that represent devices and nets within their respective netlists. LVS software is then used to determine an isomorphism between the bipartite graphs.

The unambiguous determination of isomorphism between two arbitrary graphs may be a computationally intractable problem. To address this problem, heuristic methods for identifying graph isomorphisms with acceptable reliability and efficiency for ULSI designs have been developed. One generally established heuristic method is an iterative graph-coloring method described in articles by C. Ebeling and O. Zajicek entitled "Validating VLSI Circuit Layout By Wirelist Comparison," Proceedings of ICCAD, pp. 172–173 (1983); and by C. Ebeling entitled "*Gemini II: A Second Generation Layout Validation Program*," IEEE ICCAD-88, Digest of Technical Papers, pp. 322–325, Nov. 7–10, (1988), the disclosures of which are hereby incorporated herein by reference. As described in these articles, an integer node value (color) is assigned to each node of a bipartite graph of the electrical schematic netlist and the extracted layout netlist, based on a graph invariant such as "number of nearest neighbors" (i.e., number of adjacent nodes/vertices). Each node is iteratively recolored as a function of the colors of its neighbors, until the maximum number of unique colors is achieved (i.e., an equilibrium state is achieved). Because these operations are independent of labeling, equivalent schematic and layout netlists generally will be represented by the same set of colors. A one-to-one correspondence may then be achieved by simply matching up each node in the schematic graph with a node in the layout graph that has the same color.

Unfortunately, some circuits may exhibit symmetry that may cause different nodes to receive the same color because the "neighborhoods" associated with these nodes are similar. When two or more nodes have the same color, ambiguities in selecting matching nodes may arise. Typically, this situation is handled by making a guess as to which ones of the nodes in the schematic graph correspond to the same colored nodes in the layout graph, then assigning new colors to the matched nodes and then recoloring. If the guess was incorrect, a number of nodes may fail to match when the matching is applied at the next level of hierarchy, even though an alternate guess might have resulted in a complete one-to-one mapping.

For example, the AND-OR-INVERT (AOI) cell of FIG. 1 exhibits a number of symmetries with respect to input A because input A may be independently swapped with input B or input A may be swapped with input C if and only if input B is also swapped with input D. Similar symmetries also exist with respect to inputs B, C and D. FIG. 2 illustrates an original electrical schematic (S1) of the AOI cell and an extracted layout schematic (L1) of the AOI cell. FIG. 3 illustrates an original electrical schematic (S2) which contains the AOI cell S1 of FIG. 2 as a child cell and an extracted layout schematic (L2) which contains the AOI cell L1 of FIG. 2 as a child cell. As will be understood by those skilled in the art, verification of the schematics of FIG. 3 will only be concerned with the mapping of ports (W,X,Y,Z) of the AOI cell L1 of FIG. 2 to the ports (Q,R,S,T) of the schematic S2 of FIG. 2. However, because the symmetry of the design may cause the ports of each AOI child cell in FIG. 2 to acquire the same color when the schematic and layout graphs of the AOI child cells have been colored to an equilibrium state, a conventional LVS tool may make an arbitrary mapping which may be incorrect (e.g., Q→W, R→Y, S→X, T→Z). A consequence of this arbitrary mapping may be manifested at the next level of hierarchy.

For example, as illustrated by FIG. 3, an incorrect choice in the mapping of S1 to L1 (i.e., the child cells) may cause S2 and L2 (i.e., the parent cells) to be reported as nonequivalent after a coloring algorithm has been performed on the schematic and layout graphs at the parent level. Here, devices D1–D4 are distinct devices that are connected between the ports of the AOI "child" cell and the ports of the "parent" cell. Thus, LVS software may report a mismatch between an original electrical schematic netlist and an extracted layout netlist, even though it is possible to make assignments among symmetric nodes that will result in a match. Typically, a consequence of this limitation in LVS software is that the software user must manually intervene by providing the LVS software with specific assignments to resolve ambiguities due to symmetry. Since it is not always clear where an erroneous guess was made, such manual intervention may be time consuming. For large and highly symmetric designs such as memories and gate arrays, these limitations may significantly reduce the utility of conventional LVS tools including hierarchical LVS tools using general-purpose graph isomorphism algorithms. In particular, the high degree of symmetry associated with large memories may force numerous arbitrary matchings or guesses to be made between layout and schematic. These guesses may preclude matching in the parent cells of the memories if the parent cells use permutations of the memory ports that are valid by virtue of the symmetries, but are inconsistent with the guesses.

To address some of these limitations associated with conventional verification tools, an LVS software tool 100 has been developed to determine equivalency between an integrated circuit schematic and an integrated circuit layout, using the operations 102–114 illustrated by the flow diagram of FIG. 4. This LVS software tool may be embodied in a commercially available product from the assignee of the present application, Avant! Corporation of Fremont, Calif. This software product, which is marketed under the tradename Hercules™, is more fully described in an instruction manual by the same name, Release 2. Jan. 1, (1997), the disclosure of which is hereby incorporated herein by reference. In particular, the LVS software tool of FIG. 4 can perform the operations of generating a hierarchical electrical schematic netlist having at least one parent cell and a plurality of child cells in the parent cell, Block 102, and extracting a corresponding integrated circuit layout as a hierarchical layout netlist, Block 104. An operation is also performed to generate at least one color symmetrizing matrix corresponding to a child cell in the schematic netlist, Block 106. Here, the child cell may have a number of symmetries which, when taken alone or in combination, may result in a number of electrically equivalent permutations of the child cell. As illustrated by Block 108, operations are then performed to generate schematic and layout graphs of the parent cells in the schematic and layout netlists, respectively. These graphs are similar to the above-described bipartite graphs. The nodes in the schematic graph are then colored and a first color symmetry vector is generated for a child cell in the schematic graph. Similarly, the nodes in the layout graph are colored and a second color symmetry vector is generated for a child cell in the layout graph, Block 110.

An operation is then performed to determine an equivalency between the colors of the nodes in the schematic and layout graphs based on a selected permutation of the child cell in the layout graph, Block 112, and then an operation is performed to determine a vector equivalency between a product of the color symmetrizing matrix and the first color vector and a product of the color symmetrizing matrix and the second color vector, Block 114. Finally, a membership test is automatically performed at Block 116 to determine whether the selected permutation of the child cell can be derived from the valid symmetries associated with that child cell. As described in a textbook authored by G. Butler, entitled *Fundamental Algorithms for Permutation Groups*, Springer-Verlag, p. 144 (1991), a Furst-Hopcroft-Luks version of a Schreier-Sims method may be performed. Unfortunately, although the software tool of FIG. 4 typically requires no human intervention and works well with most designs exhibiting symmetry, the automatic performance of membership test to validate the accuracy of the matched layout and schematic may incur an unduly large computational expense and limit the applicability of the above software to large integrated circuit designs having large degrees of symmetry.

Thus, notwithstanding the above described attempts, there continues to be a need to provide verification tools which have the capability of automatically resolving ambiguities in symmetric circuits. Such tools should be conservative in the identification of graph isomorphism, in the sense that if any ambiguities remain after the verification operations are performed, a nonisomorphism result should be generated and the circuits should be designated as non-equivalent even if they may be equivalent. This is because the penalty for erroneously identifying equivalent circuits as nonequivalent (i.e., manual intervention by the user) is far less onerous than the penalty for misidentifying non-equivalent circuits as equivalent (i.e., the expense of prototyping and manufacturing an incorrect design).

SUMMARY OF THE INVENTION

It is therefore an object of the present invention to provide improved methods, apparatus and computer program products that can perform post-layout verification of microelectronic integrated circuits.

It is also an object of the present invention to provide improved methods, apparatus and computer program products that can perform layout versus schematic comparison of integrated circuits.

It is another object of the present invention to provide methods, apparatus and computer program products that can perform layout versus schematic comparison of hierarchical integrated circuits having symmetrical cells therein.

These and other objects, features and advantages can be provided, according to embodiments of the present invention, by preferred methods, apparatus and computer program products for determining equivalency between integrated circuit schematics and integrated circuit layouts. These methods, apparatus and computer program products are particularly useful as layout versus schematic (LVS) comparison tools when handling hierarchical designs that exhibit high degrees of overall symmetry and/or have large numbers of cells therein having symmetrical properties. These LVS tools preferably perform the operations of coloring a graph of an integrated circuit to an equilibrium state and then identifying a "provisional" swap group of nodes having the same color within the colored graph. The colored graph may be a colored layout graph or a colored schematic graph of the integrated circuit. The colored graph may be a colored bipartite graph having both net and device nodes therein. This "provisional" swap group of nodes corresponds to pins of a device that may be swappable by virtue of the fact that the nodes associated with the pins have the same color after a graph coloring operation has been performed. A new (e.g., unique) color is then assigned to a node within the identified swap group. An operation is then performed to recolor the layout graph (with the new colored node) until another equilibrium state has been achieved. During this recoloring operation, the node receiving the assigned color may be held at the assigned color. This recoloring operation may include operations to repeatedly partition nets and devices in alternating sequence until an equilibrium colored state is achieved. At this point, a determination of whether the swap group of nodes are independently swappable can be made by evaluating whether all the nodes within the swap group, with the exception of the node that received the assigned color, have the same color. If they do, then all the nodes in the swap group can be treated as independently swappable nodes.

Preferred embodiments of LVS comparison tools may also perform an operation of identifying at least one connected group within the swap group. This operation preferably comprises determining a first connected group of nodes as nodes within the swap group that are linked together (and to the node receiving the assigned color) by other nodes that have non-unique colors within the graph. Then, after the graph has been recolored to an equilibrium state, an operation can be performed to determine whether the nodes within the first connected group that did not received the assigned color all have the same color. If so, these nodes within the first connected group can be treated as being independently swappable (i.e., as their own swap group), even if all the nodes within the "provisional" swap group are not independently swappable.

Once nodes that belong to respective connected groups have been identified, subsequent or concurrent operations may also be performed to generate a first vector of first colors corresponding to a first swap group of nodes associated with a first child cell in an integrated circuit schematic graph having symmetric pins that include independently swappable pins and dependently swappable pins. Operations may also be performed to generate a second vector of second colors corresponding to a second swap group of nodes associated with a second child cell in an integrated circuit layout graph. These graphs may be graphs of first and second parent cells containing the first and second child cells, respectively, and nets connected to input nodes of the respective child cells. To resolve symmetries identified by the presence of duplicate colors within the first and second vectors, an assignment of a new color is made to a node within the first swap group of nodes in the schematic graph and a corresponding assignment is made to a node within the second swap group of nodes in the layout graph. This new color is preferably a unique color that is not within the first vector. This assignment of a new color to a node of a child cell is, when viewed at the parent level, actually an assignment of a color to a net that may be connected to one or more pins of a child cell(s). At the parent level, this net may be treated as a single node of the graph having a single color and each pin of a child cell that is connected to the net may be treated herein as having an effective "color" equal to the color of the net. Operations are then performed to generate a third vector of third colors corresponding to the first swap group by determining a new color for one of the nodes within the first swap group using a coloring operation that is a function of a device value of the first child cell and a color of another node in the first swap group. A fourth vector of fourth colors corresponding to the second swap group are also generated by determining a new color for one of the nodes within the second swap group using a coloring operation that is a function of a device value of the second child cell and a color of another node in the second swap group.

In particular, an embodiment of the operation to generate a third vector includes generating a new color for a first node in the first swap group using a coloring operation that is a function of a device value of the first child cell and a respective color of each of the other nodes in the first swap group. To reduce computational expense, this node/pin coloring operation is independent of the colors of nodes that are dependently swappable with the first node. Similarly, the operation to generate a fourth vector includes generating a new color for a second node within the second swap group using a coloring operation that is a function of a device value of the second child cell and a respective color of each of the other nodes in the second swap group. Again, to reduce computational expense, this node coloring operation is independent of the colors of nodes that are dependently swappable with the second node. More preferably, the operation to generate a third vector comprises generating a new color for a node within the first swap group using the following relationship: New Color=Existing Node Color−(Device Value)×(Σ Colors of Other Nodes in Respective Swap Group). An identical relationship is also preferably used to generate a fourth vector.

Preferred coloring operations performed by LVS tools of the present invention may also include initially determining a first vector of first colors corresponding to a first swap group of nodes associated with a child cell in an integrated circuit layout graph and then assigning a unique node color not within the first vector of colors to a first node within the first swap group. Operations are then performed to generate a second vector of colors corresponding to the first swap group by generating a new color for the first node using the following relationship: New Color=Unique Node Color−(Device Value of Child Cell)×(Σ Colors of Other Nodes in the First Swap Group). Preferably, this relationship does not require the computational expense associated with conventional operations to generate a product of a color symmetrizing matrix and a vector of node colors for a child cell.

Operations to perform layout versus schematic comparison may also include operations to color a schematic graph of a parent cell to an equilibrium state and then recolor nets connected to first and second child cells having the same device value. The operation to recolor the nets preferably uses a net coloring operation that recolors a first plurality of symmetric pins of the first child cell and recolors a second plurality of symmetric pins of the second child cell. Operations are then performed to generate distinct device values for the first and second child cells by determining a first product of the colors of the recolored first plurality of symmetric pins and a second product of the colors of the recolored second plurality of symmetric pins. These operations to determine distinct device values are preferably performed in order to prevent an incorrect mapping of these child cells in the schematic and layout during subsequent device coloring operations. These operations preferably include determining a new device color for one cell (e.g., AOI cell) in the schematic by evaluating a product of the symmetric pin colors. In particular, the new device value for the child cell can be determined using the following relationship: New Device Value=Old Device Value+Π(Colors of Symmetric Pins of Cell). Alternatively, the new device value may be determined as the product of the colors of the symmetric pins. As determined by the inventors herein, merely determining an algebraic sum of the colors of the symmetric pins may not distinguish the AOI cells during subsequent coloring operations.

Still further embodiments of the present invention include operations to perform layout versus schematic comparison of integrated circuits having memory cells and non-memory cells therein. These operations are particularly useful when the integrated circuit layout includes one or more arrays of memory cells (i.e., bit cells) that are identified at a transistor level in the layout netlist. Such operations include scanning a layout netlist of the integrated circuit at the transistor level to identify a first device therein that has an identifiable characteristic associated with the plurality of memory cells relative to the plurality of non-memory cells. Upon detection of the identifiable characteristic, the layout netlist of a first memory cell containing the first device is traced in order to identify a first bit line and/or a first word line therein that is electrically coupled to the first memory cell. This tracing operation preferably comprises tracing a netlist path extending from the first device to a first bit line or a first word line electrically connected to the first memory cell. This netlist path may include a path defined by one or more nets and devices connected together and preferably connected between the first device and the first bit line (or first word line). The first bit line and/or first word line is then traced locally to identify a plurality of additional memory cells electrically coupled thereto along a column or row. Additional bit lines and words lines that are connected to these identified memory cells can also be traced in a similar manner to identify a plurality of rows and columns of memory cells in a memory array block.

Operations are also performed to determine one-to-one correspondence between an integrated circuit schematic netlist and the integrated circuit layout netlist by treating the plurality of identified memory cells in the layout netlist as a memory array block (or child cell containing a memory array block) and treating the bit lines and word lines as input pins to the block memory array that may be independently swappable. In particular, the words lines are typically independently swappable and the bit lines may be independently swappable as a group or independently swappable in pairs with each pair including a true and complementary bit line (BL, BLB).

The operations to trace the first bit line or the first word line may include tracing a first word line electrically coupled to the first memory cell to identify a first row of memory cells and then tracing a second bit line electrically coupled to a second memory cell in the first row of memory cells to identify a first column of memory cells. Alternatively, the operations to trace the first bit line or the first word line may include tracing a first word line electrically coupled to the first memory cell to identify a first row of memory cells and then tracing the first bit line electrically coupled to the first memory cell to identify a first column of memory cells. Bit lines and word lines connected to other memory cells in the identified rows and columns may also be traced.

In the event the integrated circuit comprises SRAM cells, the operation to scan the layout netlist may include scanning devices in the layout to identify a first field effect transistor having a gate electrode electrically connected to a source/drain region of a second field effect transistor. The scanning operation may then be continued by scanning the second field effect transistor to determine if a gate electrode of the second field effect transistor is electrically connected to a source/drain region of the first field effect transistor. Identification of the device as an SRAM bit cell is at least preliminarily confirmed if both these conditions are met. Alternatively, in the event the integrated circuit comprises DRAM cells, the step of scanning a layout netlist of the integrated circuit comprises scanning devices in the plurality of memory cells and in the plurality of non-memory cells to identify a first access transistor having a source/drain region electrically connected to an electrode of a storage capacitor. This identification at least preliminarily confirms the device as a DRAM bit cell. Subsequent local tracing operations about and around the identifiable characteristic can then be performed to confirm the identity of a memory bit cell.

Further operations to determine equivalency between an integrated circuit schematic and an integrated circuit layout containing a plurality of memory blocks therein arranged hierarchically using parent and child layout cells, may include translating word line and bit line connections from a first memory block within a child layout cell into a higher level parent layout cell containing the child layout cell and also scanning a layout netlist of the parent layout cell to identify a first device therein that has an identifiable characteristic associated with a plurality of memory cells relative to a plurality of non-memory cells within the integrated circuit layout. A layout netlist of a first memory cell containing the first device is then traced to identify a first bit line or a first word line therein that is electrically coupled to the first memory cell. This tracing operation may then continue with an operation to trace the first bit line and/or the first word line to identify a transistor level memory block within the parent layout cell. A preferred operation may then be performed to combine the transistor level memory block with the first memory block that was translated from the child cell to the parent cell.

Operations to determine equivalency may also include identifying a plurality of memory blocks defined by a respective plurality of child layout cells contained within a parent layout cell, using a depth-first search operation that identifies respective bit line and word line connections to the memory blocks. A layout netlist of the parent layout cell is then scanned to identify a first device therein that has an identifiable characteristic associated with a plurality of memory cells relative to a plurality of non-memory cells within the integrated circuit layout. This scanning operation is preferably followed by an operation to trace a layout netlist of a first memory cell containing the first device in order to identify a first bit line or a first word line therein that is electrically coupled to the first memory cell. Once this tracing operation has been performed, the identified first bit line or first word line may be traced in order to identify a transistor level memory block within the parent layout cell. The identified plurality of memory blocks may then be combined with the transistor level memory block within the parent layout cell.

BRIEF DESCRIPTION OF THE DRAWINGS

FIGS. 13A–F and 14A–F illustrate a sequence of bipartite schematic and layout graphs corresponding to the AOI child cell of FIG. 1, respectively.

FIGS. 15A–C and 16A–C illustrate a sequence of bipartite schematic and layout graphs corresponding to the parent cell of FIG. 3, respectively.

DESCRIPTION OF A PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer-readable medium may be utilized including hard disks, CD-ROMs or other optical or magnetic storage devices. Like numbers refer to like elements throughout.

Figure 5:
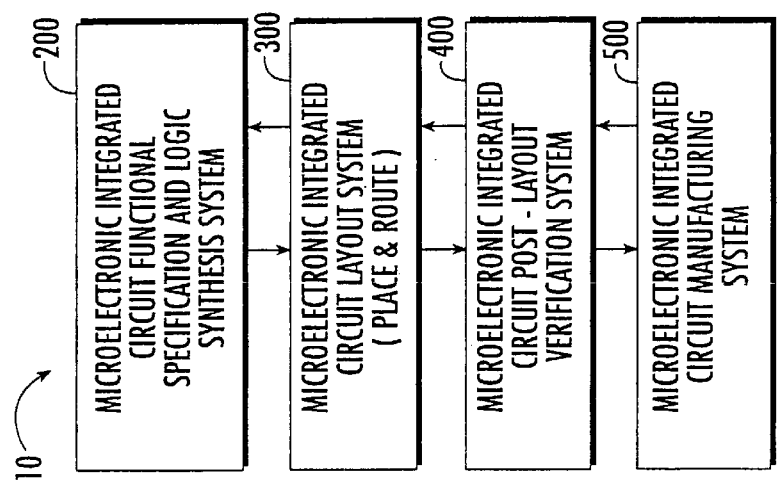
FIG. 5 illustrates a functional block diagram of microelectronic integrated circuit synthesis, layout, verification and manufacturing tools according to the present invention.

Referring now to FIG. 5, operations performed by a preferred computer aided microelectronic integrated circuit synthesis, layout, verification and manufacturing system 10 will be generally described. The system may include four general subsystems: an integrated circuit functional specification and logic synthesis system 200, an integrated circuit layout system 300, a post-layout verification system 400 and an integrated circuit manufacturing system 500. The microelectronic integrated circuit functional specification and logic synthesis system 200 may include circuit libraries or macros for such elements as logic gates, flip-flops, registers, memory elements, drivers and buffers, for example. The functional specification and logic synthesis system 200 typically provides a vehicle for generating and displaying an electrical schematic of an integrated circuit and producing a computer readable representation of the schematic as a design netlist. The microelectronic integrated circuit layout system 300 typically provides a vehicle for generating a physical layout by placing and routing an electrical circuit schematic generated by the functional specification and logic synthesis system 200. A wiring program may also be provided with the layout system 300 for automatically determining the placement of the wiring interconnect nets between active device elements within the microelectronic integrated circuit.

A verification system 400 is also preferably provided for performing an independent verification of the physical layout to ensure compliance with the requirements of the functional specification and logic synthesis system 200 as well as the manufacturing system 500. Accordingly, the verification system 400 is typically referred to as a "post-layout" verification system and is typically employed near the end of the design process. In addition to acting as an independent verification of the operability and correctness of the layout of the circuit design, the verification system 400 may provide means by which changes and optimizations can be performed. As will be understood by those skilled in the art, various other types of analyses such as timing analysis and circuit/logic simulation may be performed to check whether the specifications and requirements of the first two subsystems 200 and 300 are satisfied. After verification, the physical layout is forwarded to the manufacturing system 500 to produce the integrated circuit. The microelectronic circuit manufacturing system 500 may generate the required masks, and may control the manufacturing tools necessary to fabricate the integrated circuit on a semiconductor wafer, for example.

It will be understood by those having skill in the art that the integrated circuit functional specification and logic synthesis system 200, microelectronic circuit layout system 300 and various parts of the microelectronic integrated circuit manufacturing system 500 may be realized in whole or in part as software modules running on a computer system. Alternatively, a dedicated stand-alone system with application specific integrated circuits for performing the above described functions may be provided. The general design and operation of the functional specification and logic synthesis system 200, layout system 300 and manufacturing system 500 are well known to those having a skill in the art and need not be described further herein.

Figure 6:
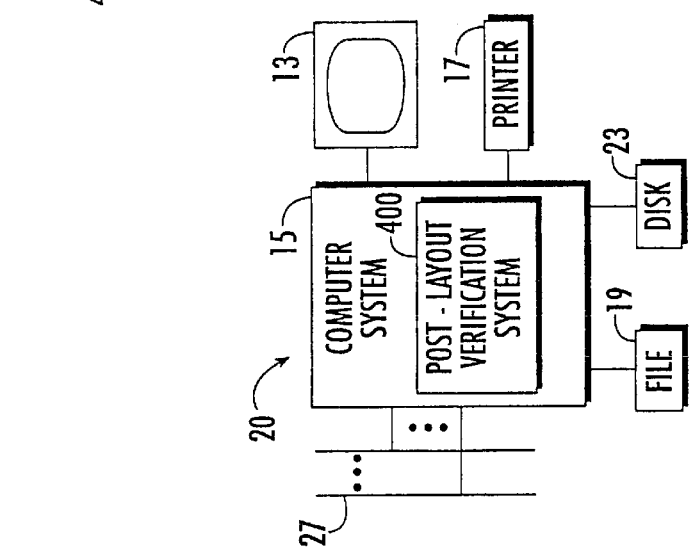
FIG. 6 illustrates a general hardware description of post-layout verification tools according to the present invention.

Referring now to FIG. 6, a general hardware description of a computer workstation containing, among other things, the integrated circuit post-layout verification system 400 of FIG. 5 will be described. As shown by FIG. 6, the workstation 20 preferably includes a computer 15 containing a post-layout verification software sub-system 400 running thereon. The post-layout verification system 400 may accept a computer representation of the electrical schematic and layout of an integrated circuit via a file 19, disk input 23 or data bus 27. A display 13 and a printer 17 are also preferably provided to assist in verifying the layout and design of the integrated circuit. The hardware design of the above described components 13, 17, 19, 27 and 23 is well known to those having skill in the art and need not be described further herein. As one example, the post-layout verification system 400 may be installed on a computer system such as an UltraSPARC 5 workstation manufactured by Sun Microsystems Computer Corporation (see, http://www.sun.com).

Figure 7:
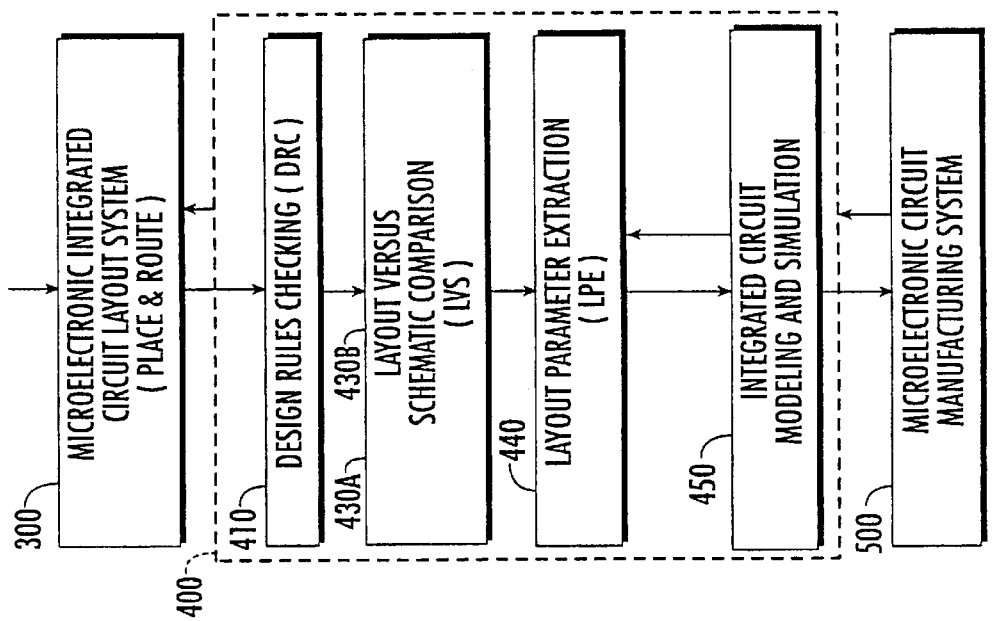
FIG. 7 illustrates general operations performed by post-layout verification tools, methods and computer program products according to the present invention.

Referring now to FIG. 7, there is illustrated a general overview of operations that are preferably performed by embodiments of post-layout verification systems 400 of the present invention. In particular, the post-layout verification system 400 is illustrated as performing a plurality of operations 410, 430A–430B and 440–450. For the sake of clarity, these operations are illustrated and described as discrete operations, however, in practice many of these operations may be combined and performed in parallel. Additional operations may also be performed by the post-layout verification system 400. The first operation 410 is performed by a design rule checking (DRC) tool which runs comprehensive hierarchical design rule checks on a geometric database containing the physical layout of an integrated circuit to be verified. The operations performed by the design rule checking tool include, among other things, checking for area, grid, length, size, spacing, corner, enclosure, intersection and overlap errors, for example. The second operations 430A–430B are performed by a preferred hierarchical layout versus schematic (LVS) tool which extracts a hierarchical netlist from the geometric layout database and compares it to the electrical schematic netlist. Layout and schematic logic agreement is then verified at hierarchical matching points, for example.

The third operation 440 is performed by a layout parameter extraction (LPE) tool. This tool may, among other things, perform an initial operation of modeling each of a plurality of interconnect nets within the integrated circuit layout in order to obtain estimates of the parasitic resistance and capacitance of the nets. An exemplary LPE tool is described in detail in U.S. Pat. No. 5,896,300 to Raghavan et al., entitled "Methods, Apparatus and Computer Program Products for Performing Post-Layout Verification of Microelectronic Circuits by Filtering Timing Error Bounds for Layout Critical Nets", assigned to the present assignee, the disclosure of which is hereby incorporated herein by reference. Once this layout parameter extraction operation 440 is complete, modeling and simulation operations 450 are performed. The results obtained from these modeling and simulation operations may also be passed back to the layout parameter extraction tool 440. As illustrated by the reverse upward sequence of arrows in FIGS. 5 and 7, the performance of post-layout verification may necessitate redesign of the integrated circuit by the functional specification and logic synthesis system 200 and/or modifying the physical layout using the layout system 300. Finally, in the event the integrated circuit is verified for design rule compliance and the layout versus schematic (LVS) comparison and modeling and simulation operations yield acceptable results, the physical layout is forwarded to the manufacturing system 500 to produce the integrated circuit.

To further exemplify the characteristics of state-of-the-art LVS tools that may be embodied in post-layout verification systems and provide further background to the subject matter of the present invention, the operations illustrated by the flowcharts of FIGS. 8 and 9 will be described. Such LVS tools are more fully described in detail in U.S. Pat. No. 6,009,252 to Lipton, entitled "Methods, Apparatus and Computer Program Products for Determining Equivalencies Between Integrated Circuit Schematics and Layouts Using Color Symmetrizing Matrices", assigned to the present assignee, the disclosure of which is hereby incorporated herein by reference. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means that implement the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means that implement the functions specified in the flowchart block or blocks. Accordingly, blocks of the flowchart illustrations support combinations of means that perform the specified functions, combinations of steps that perform the specified functions and program instruction means that perform the specified functions.

Figure 8:
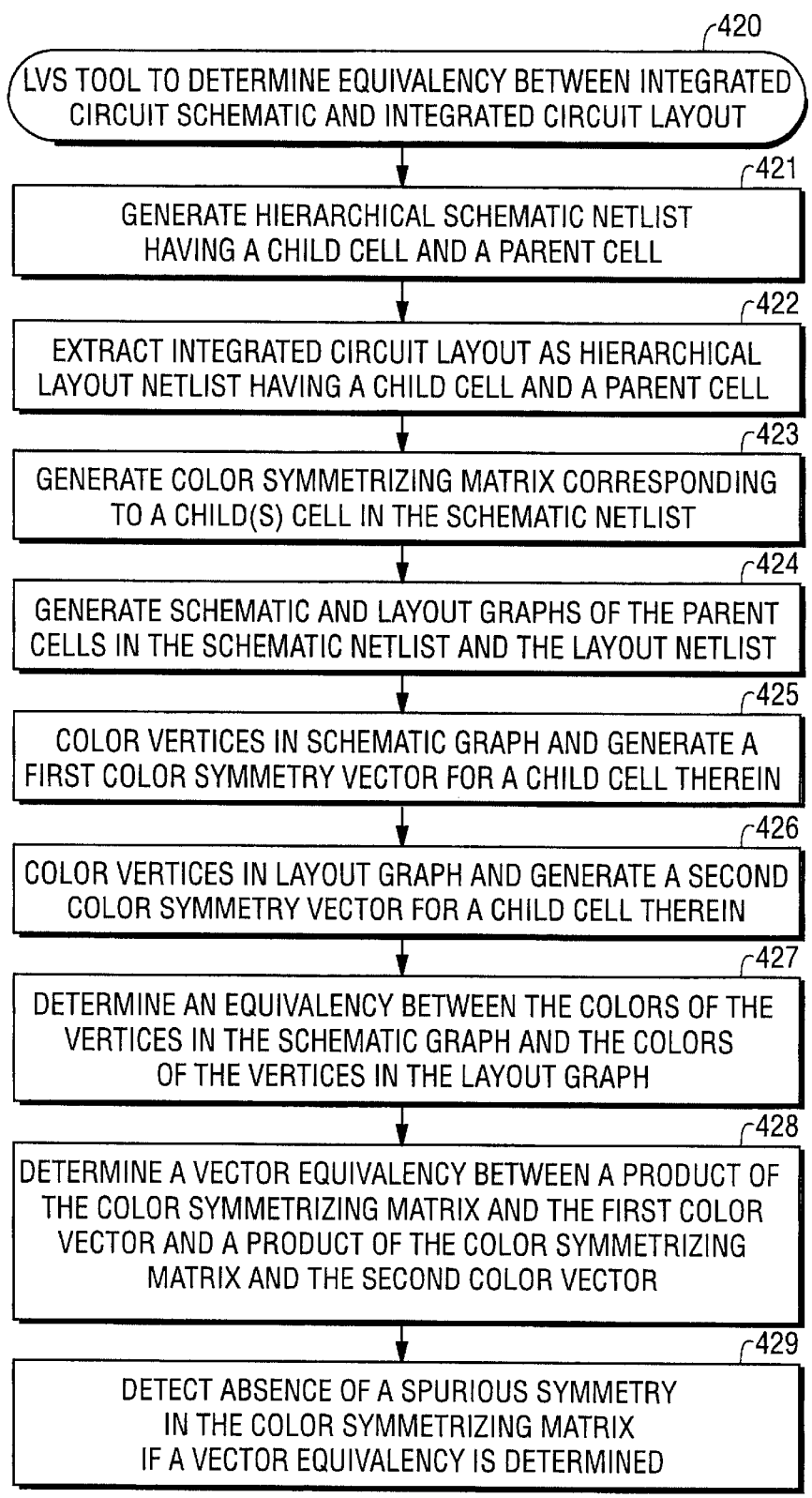
FIG. 8 is a flow diagram of operations performed by a layout versus schematic (LVS) comparison tool according to the prior art.
Figure 9:
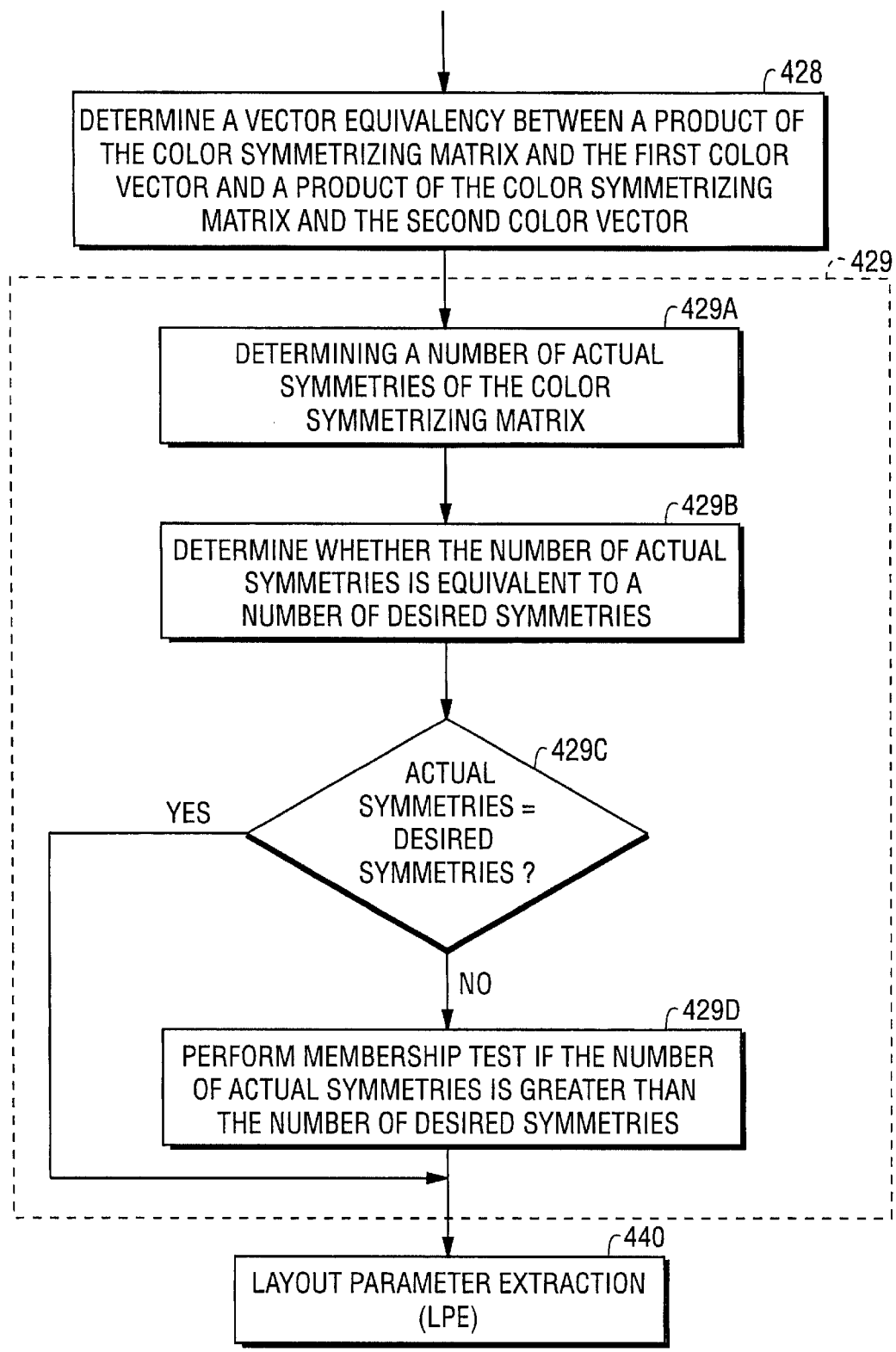
FIG. 9 is a partial flow diagram illustrating operations to detect absence of spurious symmetries in color symmetrizing matrices, according to the flow diagram of FIG. 8.

In particular, the operations 420 illustrated by FIGS. 8–9 include operations to determine equivalency between hierarchical integrated circuit schematics and hierarchical integrated circuit layout designs using color symmetrizing matrices and operations to detect absence of spurious symmetries in the color symmetrizing matrices. These operations may be performed to reduce the computational expenses associated with the automatic performance of complex membership tests to determine whether permutations of cells in a hierarchical integrated circuit layout design can be derived from valid symmetries of the respective cells therein.

The operations include representing the integrated circuit schematic as a hierarchical schematic netlist having at least one child cell therein and a parent cell containing the at least one child cell, Block 421. An operation is also performed to extract the integrated circuit layout as a hierarchical layout netlist, Block 422. This operation may be performed using conventional techniques. As described more fully hereinbelow with respect to an exemplary portion of an integrated circuit containing an AND-OR-INVERT (AOI) cell therein as a child cell, a color symmetrizing matrix corresponding to the child cell is also generated, Block 423. The child cell may also comprise a device having AOI-type swappable symmetry with respect to its input pins (which have classes, but do not receive colors) and input nodes (which receive colors). Input nodes connected to swappable input pins are referred to herein as "swappable nodes". A bipartite schematic graph of the parent cell in the hierarchical schematic netlist is also generated along with a bipartite layout graph of the parent cell in the hierarchical layout netlist, Block 424. The nodes in the schematic graph are then colored and a first color symmetry vector for the child cell therein is generated from the colors of the "input" nodes of the child cell in the graph, Block 425. These "input" nodes of the child cell in the graph correspond to the "net" nodes of the graph that are connected to the input pins of the child cell. Similarly, the nodes in the layout graph are colored and a second color symmetry vector for the child therein is generated, Block 426. An equivalency between the colors of the nodes in the schematic graph and the colors of the nodes in the layout graph is then determined, Block 427.

Based on this equivalency, an operation may then be performed to determine a vector equivalency between a product of the color symmetrizing matrix and the first color symmetry vector and a product of the color symmetrizing matrix and the second color symmetry vector, Block 428. If these vectors are equivalent, an equivalency between the integrated circuit schematic and the integrated circuit layout may be present. However, a possibility may still exist that with respect to the corresponding symmetric child cells in the schematic and layout, isomorphism (i.e., one-to-one correspondence) between the schematic and layout is not present.

To address this possibility, an operation may be performed to detect the absence of a spurious symmetry in the color symmetrizing matrix. If an absence is detected, the presence of the vector equivalency will unequivocally establish the one-to-one correspondence with respect to the child cell being analyzed. Therefore, the need to perform a computationally expensive membership test, for example, to determine whether a selected permutation can be derived from valid symmetries can be successfully eliminated. In particular, rather than automatically performing a complex membership test which may require considerable amounts of computational expense to confirm equivalency (particularly for large integrated circuits such as memories and gate arrays which have high degrees of symmetry), an operation is performed to detect absence of a spurious symmetry in the color symmetrizing matrix, Block 429, by initially checking whether the number of actual symmetries of the color symmetrizing matrix is equivalent to the number of different symmetrical port configurations or permutations of the child cell undergoing analysis (i.e., the number of desired symmetries), Blocks 429A–429B. As illustrated by Blocks 429C and 429D, if the number of actual symmetries of the color symmetrizing matrix is greater than the number of desired symmetries, a membership test will need to be performed to verify equivalency. If, on the other hand, the number of actual and desired symmetries are determined to be the same which, in practice, has been found to be true in the vast majority of cases, the computationally expensive membership test can be eliminated altogether. These operations are repeatedly performed for all cells, at each level of hierarchy.

Figure 10:
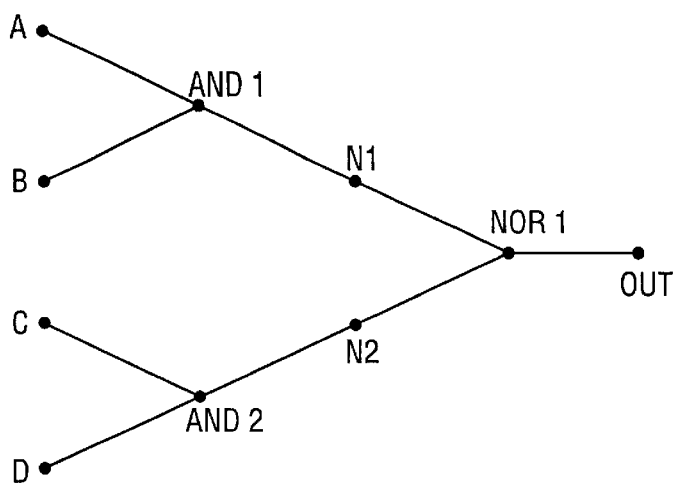
FIG. 10 illustrates a graphical representation of the symmetrical AOI circuit of FIG. 1.

Further description of the operations of FIGS. 8 and 9 will now be provided by illustrating performance of these operations on an integrated circuit containing an AND-OR-INVERT (AOI) cell therein as a child cell. In particular, schematic and layout netlists are initially generated for corresponding schematic and layout designs of a hierarchical integrated circuit. Here, the layout netlist may be generated by extracting the layout design using conventional techniques well known to those skilled in the art. The schematic and layout netlists are then abstracted into respective bipartite graphical representations where the nodes of the graph represent devices or nets. For example, FIG. 10 illustrates a graphical representation of the symmetrical AOI circuit of FIG. 1. The graphical schematic and layout representations are provided with an initial partitioning of nodes which distinguishes between nets and devices, and also between external nets (e.g., input nodes A, B, C, D and output port Z) and internal nets (N1 and N2). As will be understood by those skilled in the art, graphical automorphism detection operations are then performed on the graphical representations. Here, the purpose of the initial partitioning is to constrain the automorphism operations to find symmetries that do not involve swapping between partitions. Moreover, because the ability to swap devices and nets is an artifact of the graphical abstraction and not a real possibility, it may be excluded. Swapping of input nodes and internal nets may also be excluded because hierarchical analysis is only concerned with symmetries among the input nodes.

Using conventional techniques such as those described in the aforementioned Ebeling articles, a conventional iterative coloring process can then be applied to the nodes of the schematic and layout graphs. As will be understood by those skilled in the art, the establishment of unique colors at the nodes of the schematic and layout graphs typically permits matching of the nodes. Nodes that may be swapped by a valid symmetry will also have identical colors (although not all nodes with identical colors are necessarily swappable). However, in order to distinguish between good and bad permutations, a set (e.g., vector) of color values will need to be established using a conventional coloring function (F) that depends not just on the neighbors of a respective node, but on all the nodes that share a symmetry with it. Here, a coloring function is desired that results in the same set of colors when applied to valid permutations and a different set of colors when applied to invalid permutations. In particular, when the layout is a valid permutation of the schematic, the coloring function will result in the same set of colors for the layout and schematic, and these colors will be related by the permutation. On the other hand, when the layout is not a valid permutation of the schematic, the coloring function will result in different sets of colors.

A preferred coloring function (F) may be characterized algebraically, where:

$\vec{n} \equiv$ vector of color values $P_g, P_b \equiv$ good & bad permutations $\vec{n}' \equiv$ new color values $\vec{n}' \equiv F(\vec{n})$ Require:

$F(P_g(\vec{n})) = P_g(\vec{n}') = P_g(F(\vec{n}))$ $F(P_b(\vec{n})) \neq P_b(\vec{n}') = P_b(F(\vec{n}))$ Assume F and P can be represented by matrix multiplication:

$F(\vec{n}) = F\vec{n}$ $P(\vec{n}) = P\vec{n}$

Require $\forall \vec{n}$:

$FP_g\vec{n} = P_gF\vec{n}$ $(FP_b\vec{n})_i \neq (P_bF\vec{n})_i$

Note that the condition that $(FP_b\vec{n})_i \neq (P_bF\vec{n})_i$, is more stringent than the condition that $FP_g\vec{n} = P_gF\vec{n}$ because not only must the two sides of the equation be unequal, but each component of each side must be unequal. With this understood, a simplification may be performed:

$FP_g = P_gF$ $FP_b \neq P_bF$

Finally:

$P_g^{-1}FP_g = F$ $P_b^{-1}FP_b \neq F$

These equations describe a matrix F which is symmetric with respect to the permutation represented by $P_g$, but not symmetric with respect to $P_b$. Thus, the desired function is a matrix which exhibits symmetry with respect to all legal permutations and violates symmetry with respect to all illegal permutations.

Figure 1:
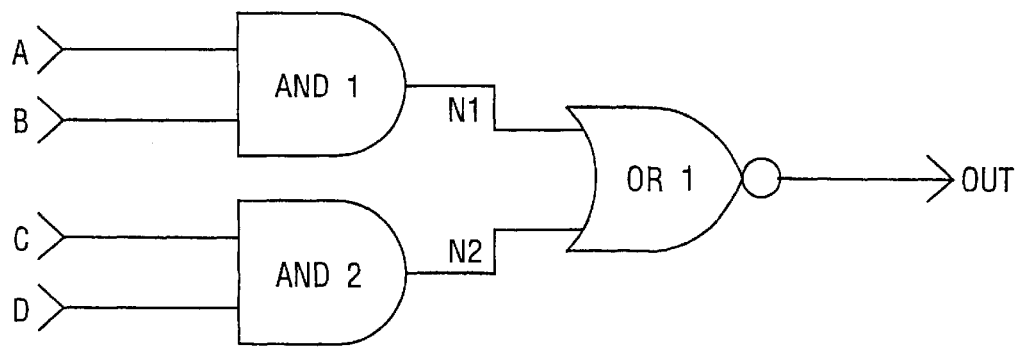
FIG. 1 is an electrical schematic of an AND-OR-INVERT (AOI) circuit.
Figure 2:
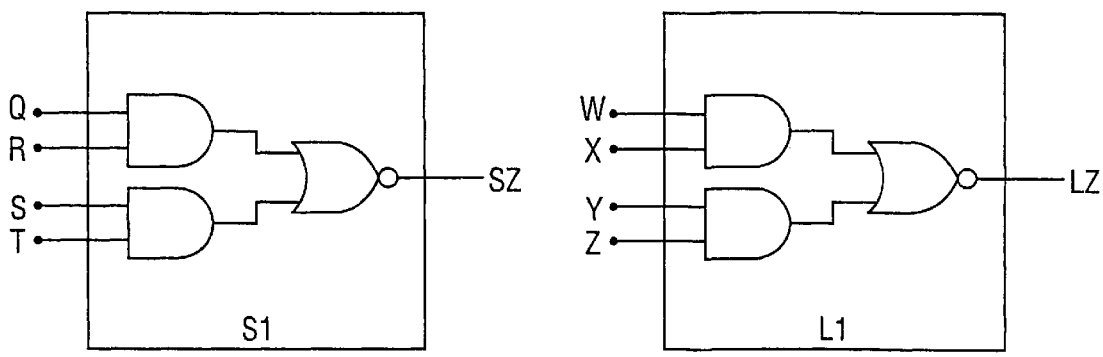
FIG. 2 is an electrical schematic of an AOI cell (S1) and a schematic of an AOI cell (L1).

As described above, this preferred matrix is a color symmetrizing matrix (CSM). An exemplary CSM which encodes the symmetries of the AOI cell of FIG. 1 is provided as:

$$CSM = \begin{bmatrix} 0 & 11 & 13 & 13 \\ 11 & 0 & 13 & 13 \\ 13 & 13 & 0 & 11 \\ 13 & 13 & 11 & 0 \end{bmatrix}$$

Figure 11:
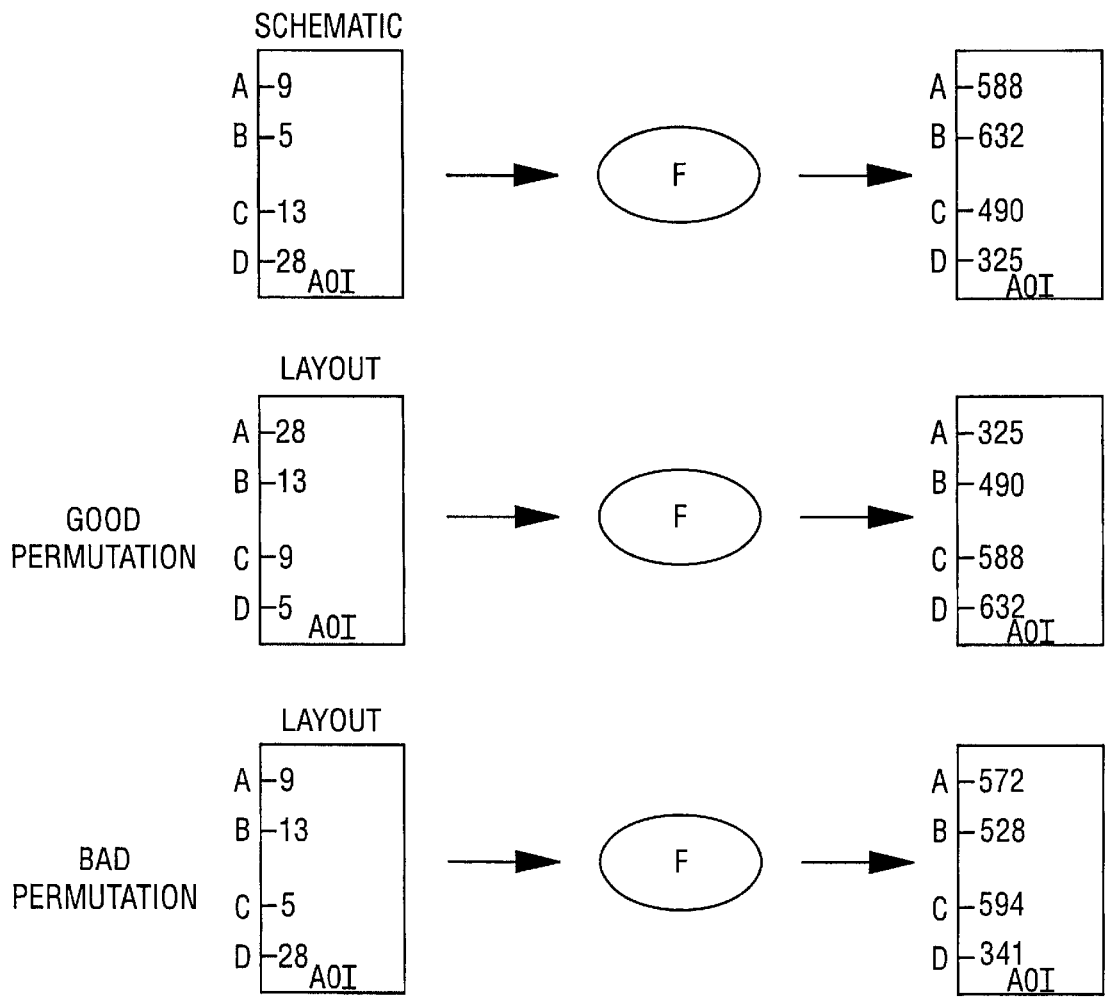
FIG. 11 illustrates operations to determine a first product of the color symmetrizing matrix (for the AOI circuit of FIG. 1) and a first color symmetry vector corresponding to an AOI child cell in a schematic graph, a second product of the color symmetrizing matrix and a second color symmetry vector corresponding to an AOI child cell in a layout graph configured as a good permutation, and a third product of the color symmetrizing matrix and a third color symmetry vector corresponding to an AOI child cell in a layout graph configured as a bad permutation.

As illustrated by FIG. 11, respective products of the CSM and (i) a vector of colors for the input nodes (pins) of the schematic AOI, (ii) a correctly permuted vector of colors associated with the input nodes (pins) of the layout AOI and (iii) an incorrectly permuted vector of colors associated with the input nodes of the layout AOI, results in two vectors (486, 514, 350, 245) and (245, 350, 486, 514) which have the same set of color values and are thereby equivalent, and one vector (454, 426, 438, 277) which is different. The vectors which agree correspond to the schematic and layout based on a "good" permutation of the AOI cell. Based on these operations, a determination of vector equivalency for all cells at each level of hierarchy, Block 428 of FIGS. 8 and 9, can be used to determine LVS equivalency.

A preferred approach to form the above CSM includes building the matrix in the most restrictive way possible so that the matrix is guaranteed to have all the desired symmetries. The matrix may be constructed by starting with an empty (zero) matrix (with dimensions equal to the number of interdependent input nodes: e.g., a 4×4 matrix for an AOI cell) and inserting an arbitrary number somewhere into the matrix. Prime numbers are preferably used to minimize the probability of collisions. This prime number is then copied into every entry whose indices can be related to the indices of the original entry by some combination of legal permutations. The result is a matrix that is symmetric with respect to all legal permutations. If there are any empty entries in the matrix remaining, a new and different number is inserted into an empty entry, and the process is repeated. This procedure is continued until there are no empty entries. At the end of any given iteration, the CSM matrix is provided with the desired symmetries, however, by iterating until the matrix is full, it is possible to minimize the probability of spurious symmetries.

A preferred method of counting the number of symmetries of the CSM is based on a version of the Schreier-Sims algorithm. This version is more fully described in Chapter 10 of the aforementioned textbook by G. Butler entitled "*Fundamental Algorithms for Permutation Groups*" and in Chapter 14 of a textbook by P. Cameron entitled "*Combinatorics*" Cambridge University Press (1994), the disclosures of which are hereby incorporated herein by reference. In particular, this preferred method includes determining a number N equal to the index of the last row of the CSM matrix (N=4 for the CSM matrix corresponding to the AOI cell). The orbit of N is then determined. Here, an orbit is defined as the set of indices (include N itself) which N may be mapped into by any legal permutation or combination of permutations. Next, any permutations which involve moving N are ignored so that attention is restricted to the subgroup that is the stabilizer of N. Then, counting backwards from N, the next non-unique row is found and N is then set to this index. These steps are repeated until the subgroup is of the order one.

Unfortunately, it is not possible to guarantee that such a matrix will not have "spurious" symmetries which might enable an incorrectly permuted vector of colors to be reported as correct. If a spurious symmetry is present in the CSM, an LVS comparison tool may still make a correct mapping, but it is not forbidden from making an incorrect mapping. However, as described in the '252 patent to Lipton, an incorrect mapping can be prevented by determining the number of actual symmetries of the CSM (i.e., the order of the permutation group which leaves the matrix invariant), Block 429A in FIG. 9, and then comparing this number with the number of desired symmetries of the particular child cell being analyzed. If these two numbers are equal, the CSM matrix will be guaranteed to have all desired symmetries and no spurious symmetries. Thus, the determination of vector equivalency at Block 428 of FIGS. 8 and 9 will unequivocally establish equivalency between the schematic and layout. If the number of actual symmetries of the CSM is greater than the number of desired symmetries (the number of actual symmetries of the CSM should never be less), a further check will need to be performed to verify LVS equivalency. This further check includes performing a membership test, preferably using a Schreier-Simms algorithm, to verify that the final mapping is a valid combination of the original symmetries.

As will be understood by those skilled in the art, the Schreier-Simms algorithm is a standard method which can be used to determine whether an arbitrary permutation may be expressed by some combination of generated permutations. If the mapping fails this test, the schematic and layout are reported as nonequivalent, but if the mapping passes this test, the schematic and layout will be reported as equivalent notwithstanding the fact that the number of actual symmetries of the CSM was greater than the number of desired symmetries associated with the symmetric cell under analysis. Thus, the LVS comparison tools of FIGS. 8–9 can be used to perform post-layout verification of larger and more highly integrated circuits because the need to always perform computationally expensive membership tests to determine whether a selected permutation of a symmetric cell can be derived from valid symmetries, can be frequently eliminated.

Figure 12A:
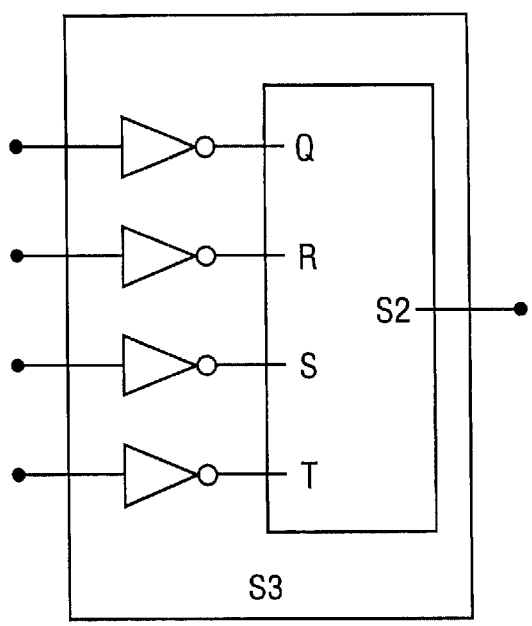
FIGS. 12A and 12B illustrate electrical schematics of parent cells having the same symmetries as respective child cells therein.
Figure 12B:
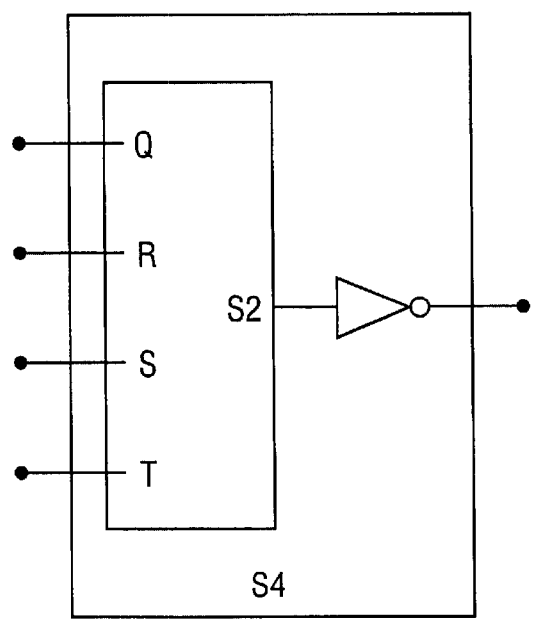
Figure 17A:
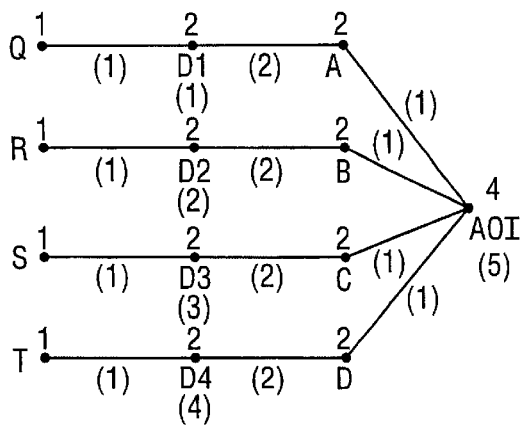
FIGS. 17A–D, 18A–D and 19A–D illustrate a sequence of schematic graphs, correct layout graphs and incorrect layout graphs of a parent cell of FIG. 3, respectively.
Figure 17B:
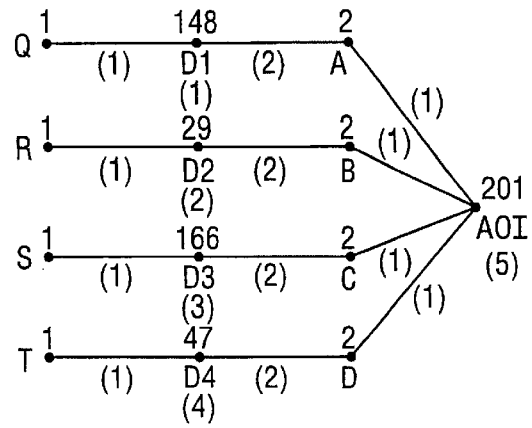
Figure 18A:
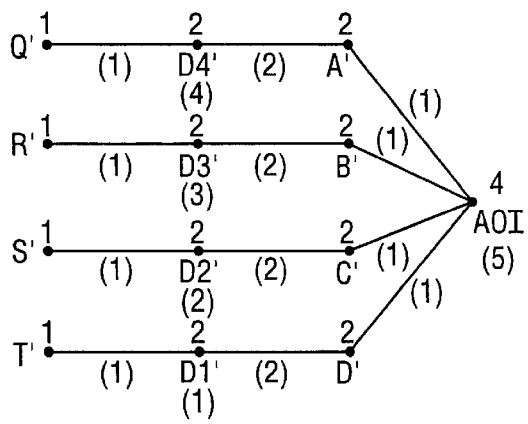
Figure 18B:
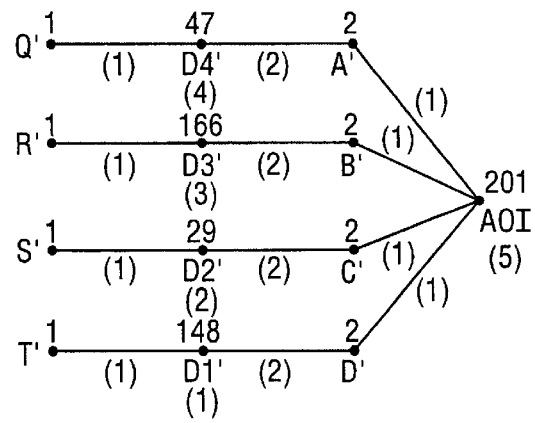
Figure 17C:
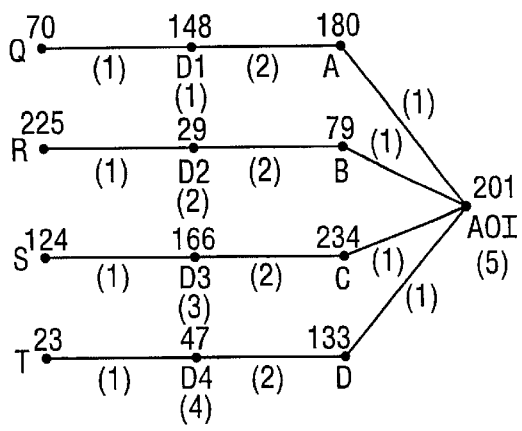
Figure 17D:
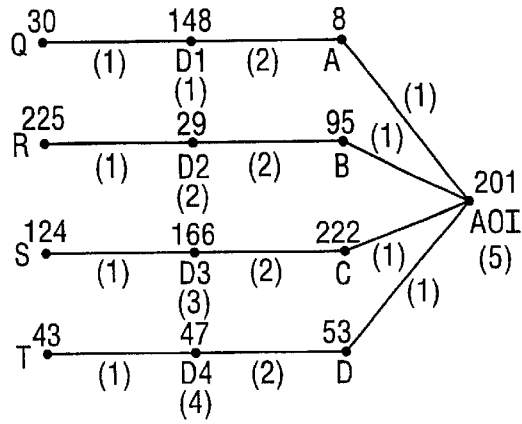
Figure 18C:
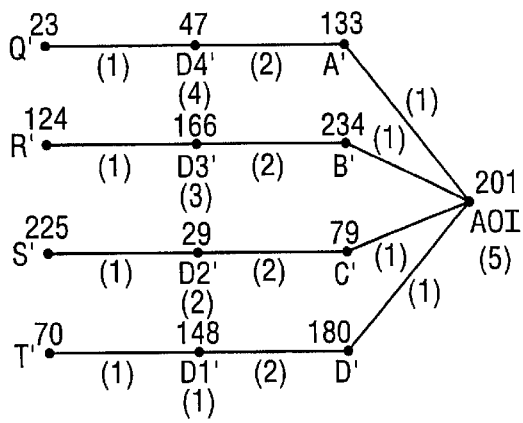
Figure 18D:
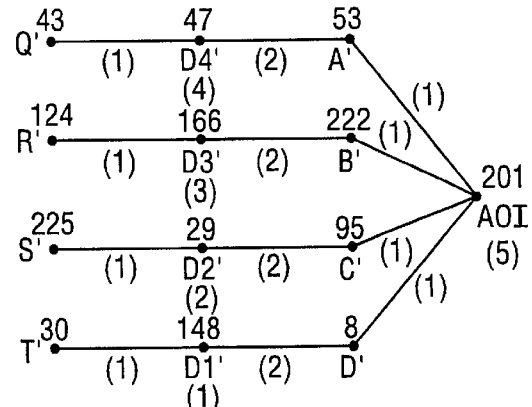

A conventional LVS tool may have limited capability to propagate symmetries by inferring symmetries of the parent cell from the symmetries of a child cell therein. An example of a parent cell which exhibits the same symmetries as a child cell therein is illustrated by FIG. 12A. Accordingly, an LVS tool may not be able to take full advantage of the node symmetries of the cell of FIG. 12A when analyzing a schematic and layout containing such a symmetric cell. Symmetries may, however, be readily inferred when the symmetric nodes of the child cell (e.g., AOI cell) are connected directly to the input nodes of the parent cell, with no intervening devices, as illustrated by the parent cell of FIG. 12B. An LVS tool preferably takes these latter symmetries into account so that the symmetries of a child cell may be propagated to a parent cell when the LVS tool is evaluating a grandparent cell containing the parent cell.

A general analysis of a simple two-level integrated circuit design is now provided to demonstrate how a conventional method of arbitrarily breaking symmetry in a child cell may result in an erroneous mismatch of the parent cells and how a method of encoding the symmetries of a child cell using the color symmetrizing matrix (CSM) will automatically resolve symmetries in the parent cell. First, a partition function P is generated as:

$P_{NET}$=[node value+3Σ(neighbor node values)+137Σ(pin class)]mod 256

$P_{DEVICE}$=[node value+3Σ(neighbor node values)+137(device class)]mod 256

These partition functions are chosen to depend on the local structure of the bipartite schematic and layout graphs illustrated by FIGS. 13–14, respectively, and be independent of labeling. The coefficients of "3" and "137" are arbitrary, and are chosen to minimize the likelihood of collisions (i.e., the possibility that different sets of input values might accidentally result in the same function value). The modulus of "256" is used here for convenience, but is preferably selected as large as possible to minimize collisions (typically the largest unsigned integer permitted by the hardware performing the LVS operations). FIGS. 13 and 14 illustrate how the method of symmetry breaking results in a valid mapping from schematic nodes to layout nodes A→D', B→C', C→B' and D→A'. Node values are shown next to each node. Each node value identifies the color of a net (connected to a pin of a device) or the color of a device and the terms "node value" and "color" are used interchangeably herein. Numbers in parentheses are pin classes when adjacent to an edge, or device classes when adjacent to a device node.

Referring now specifically to FIGS. 13A and 14A, the nodes of the graphs are initialized by assigning node values/colors as equal to the number of adjacent nodes. After the graphs are initialized, a graph recoloring operation may be performed using a sequence of alternating net and device coloring operations. For example, as illustrated by FIGS. 13B and 14B, a device coloring operation may be performed by partitioning devices. The node value of 152 for the AND1 and AND2 devices and the node value of 36 for the NOR device are obtained using the device partition function $P_{DEVICE}$:

152=[3+3(1+1+2)+137(1)]mod256

36=[3+3(2+2+1)+137(2)]mod256

Following the device partition of FIGS. 13B and 14B, a net coloring operation is performed by partitioning the nets, as illustrated by FIGS. 13C and 14C. The node value of 82 for the nets A, B, C and D, the node value of 209 for the nets N1 and N2 and the node value of 127 for the net OUT are obtained using the net partition function $P_{NET}$:

82=[1+3(152)+137(1)]mod256

209=[2+3(152+36)+137(2+1)]mod256

127=[1+3(36)+137(2)]mod256

At this point, the symmetries of the bipartite graphs are manifested by the similar node values/colors, and it is apparent that further partitioning will not resolve symmetries. When this occurs, the graphs can be treated as being in respective equilibrium states, because further net and device coloring operations will not result in a change in the number of distinct colors. Because of the symmetry, a guess can be made. That is, a matching is arbitrarily imposed between two nodes of the same value, and they are given a new unique (arbitrary) value. In particular, in FIGS. 13D and 14D, a selection is made between AND1 in the schematic and AND2 in the layout and their node values are set to 103. It would also have been acceptable to make the selection between AND2 in the schematic and AND1 in the layout, or any matching among the other nonsingular partitions (i.e., between (A,B,C,D) and (A',B',C',D') or between (N1, N2) and (N1', N2')). Referring now to FIGS. 13E and 14E, another net partition is performed and once again it is apparent that no further partitioning will reduce the symmetry. Finally, in FIGS. 13F and 14F, the remaining matches (i.e., two net assignments) necessary to a complete mapping from schematic to layout are made.

Referring now to FIGS. 3 and 13–16, an illustration is provided on how to use of a conventional method of comparing a parent cell schematic with a parent cell layout (that is valid by virtue of the symmetries of the AOI cell) may result in apparent non-equivalence. At the parent level illustrated by FIGS. 15–16, the AOI child cell is represented as a single node with four input nodes (the output node has no bearing on the results in this case, and is omitted for simplicity). The input nodes of the AOI child cell are differentiated (consistent with the schematic and layout graphs of FIGS. 13E and 14E, respectively) by the assignment of a distinct pin class to each pin, as illustrated. Matching pins in the schematic and layout are assigned the same class. The input nodes A, B, C and D of the AOI are connected to four distinct devices (D1–D4), each of which has a different device class, as illustrated by FIGS. 15A and 16A.

Referring now to FIGS. 15B–15C and FIGS. 16B–16C, a single device partition followed by a single net partition (using the above partition functions) is sufficient to attain unique values for all nodes. The apparent non-equivalence, manifested in FIGS. 15C and 16C by differing node values between the schematic and layout, is due to the fact that the pin classes (as assigned) do not exhibit the node symmetries of the AOI child cells. As will be understood by those skilled in the art, this is a consequence of an unfortunate choice when an arbitrary match was assigned in FIGS. 13D and 14D.

Figure 3:
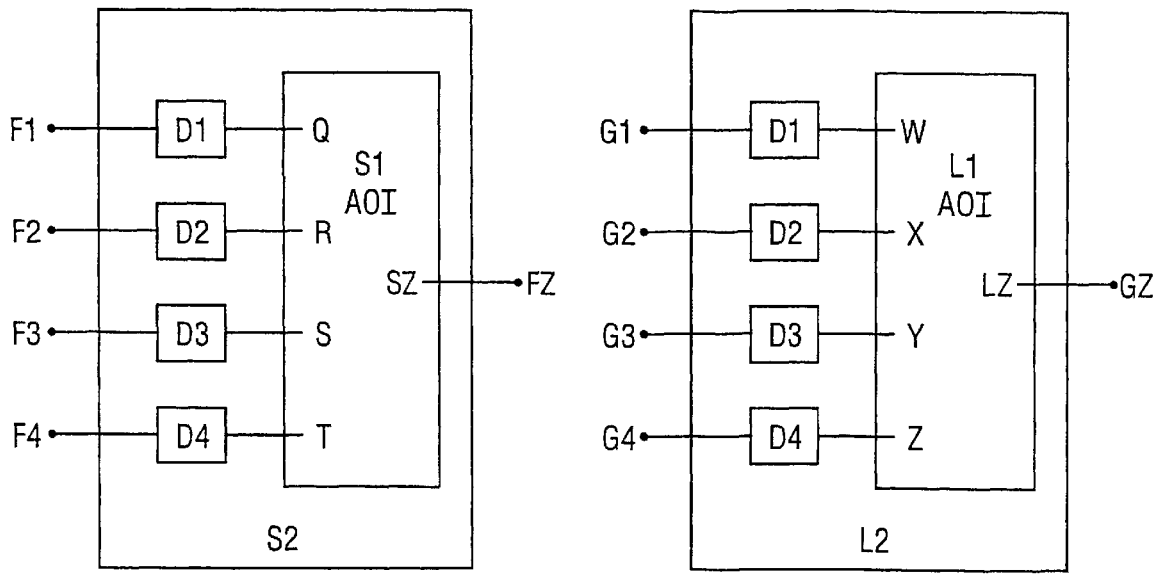
FIG. 3 is an electrical schematic of a parent cell (S2) containing the cell S1 of FIG. 2 and an extracted schematic of a parent cell (L2) containing the cell L1 of FIG. 2.
Figure 4:
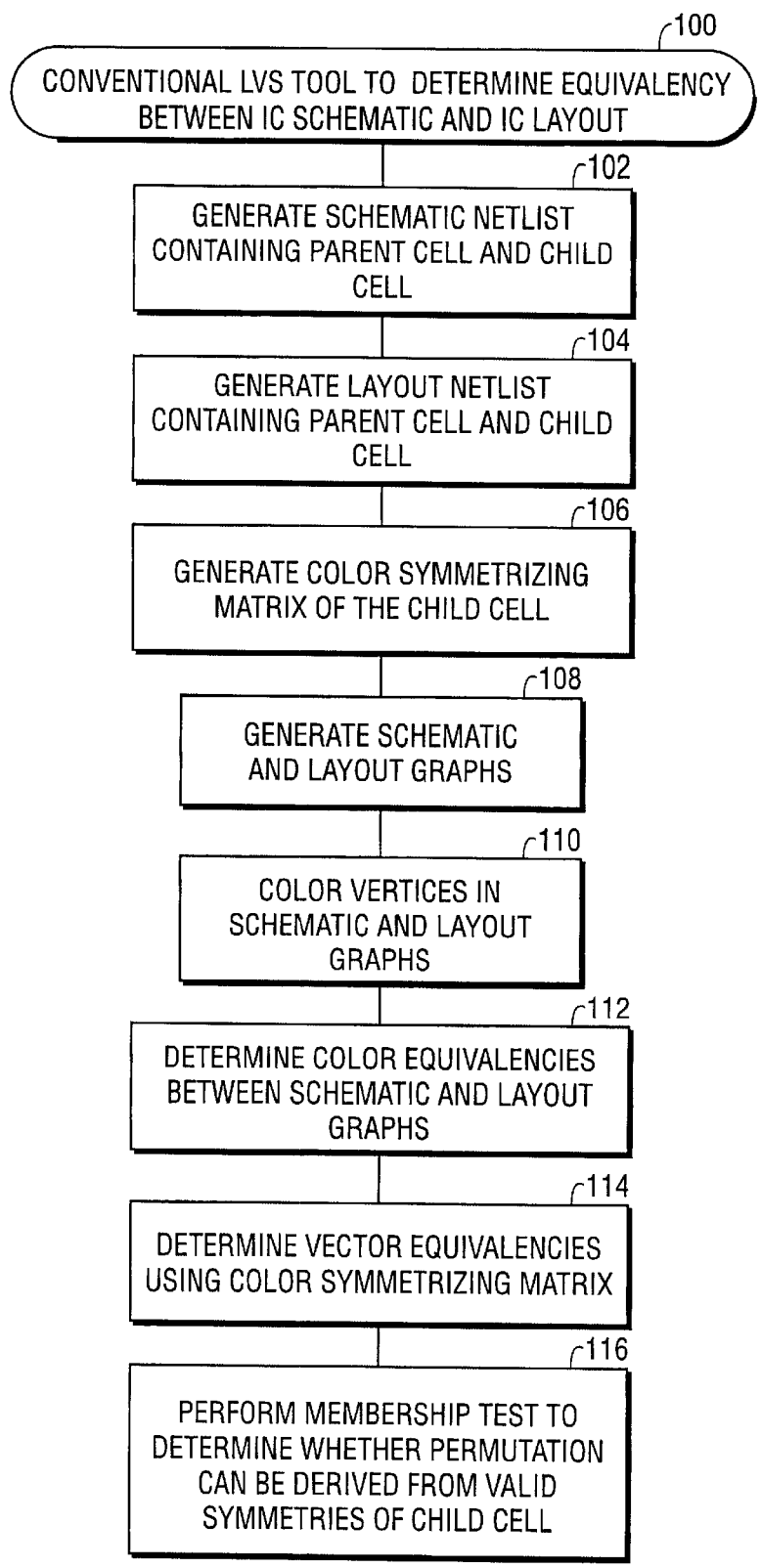
FIG. 4 is a flow diagram of operations performed by a layout versus schematic (LVS) comparison tool according to the prior art.

Referring now to FIGS. 17A–17D, 18A–18D and 19A–19D, a graphical illustration of the use of a color symmetrizing matrix (CSM) to resolve symmetries, is provided. In particular, in FIGS. 17A, 18A and 19A, the bipartite graphs corresponding to a schematic of the device of FIG. 3, a correct layout of the device of FIG. 3 and an incorrect layout of the device of FIG. 3, are initialized. However, unlike the graphs of FIGS. 15–16 (where different classes were assigned to each pin), all pins that are related by a symmetry and may be interchanged by some valid permutation (i.e., share the same orbit), are assigned the same class. In the method illustrated by FIGS. 15–16, such assignment could result in forbidden permutations being evaluated as correct. However, the LVS tools described in accordance with the '252 patent to Lipton use color symmetrizing matrices, the application of the CSM prevents forbidden permutations from being evaluated as correct.

Referring now to FIGS. 17A–17D, a partitioning of the schematic graph of the device of FIG. 3 is provided, with the CSM being applied to the input nodes of the AOI (which are arranged as a vector) as a final step. In particular, in FIG. 17A the schematic graph is initialized, in FIG. 17B a device partition is performed and in FIG. 17C a net partition is performed. The CSM shown below is then applied to a vector of colors corresponding to the pins of the AOI in FIG. 17C which are arranged from A–D as: [180, 79, 234, 133]. Using a modulus of 256, as described above, a new vector of colors is generated as [8, 95, 222, 53] in FIG. 17D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 180 \\ 79 \\ 234 \\ 133 \end{bmatrix} \Rightarrow \begin{bmatrix} 8 \\ 95 \\ 222 \\ 53 \end{bmatrix}$$

Referring now to FIGS. 18A–18D, a partitioning of the correct layout graph is provided, with the CSM being applied to the pins of the AOI (which are arranged as a vector) as a final step. This correct layout graph is equivalent to the schematic by a valid permutation of A→D', B→C', C→B' and D→A'. In particular, in FIG. 18A the correct layout graph is initialized, in FIG. 18B a device partition is performed and in FIG. 18C a net partition is performed. The CSM is then applied to a vector of colors corresponding to the pins of the AOI in FIG. 18C which are arranged from A–D as: [133, 234, 79, 180]. Using a modulus of 256, a new vector of colors is generated as [53, 222, 95, 8] in FIG. 18D. This vector is equivalent to the corresponding vector associated with the schematic graph of FIG. 17D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 133 \\ 234 \\ 79 \\ 180 \end{bmatrix} \Rightarrow \begin{bmatrix} 53 \\ 222 \\ 95 \\ 8 \end{bmatrix}$$

Figure 19A:
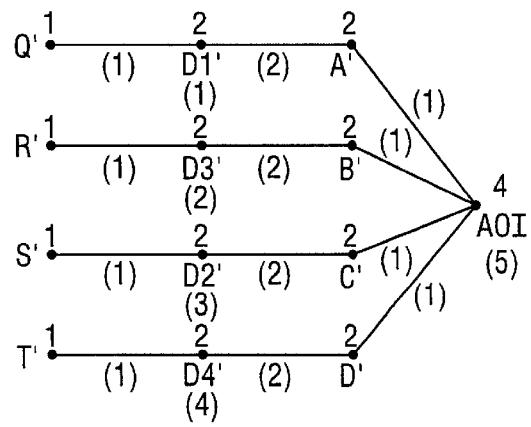
Figure 19B:
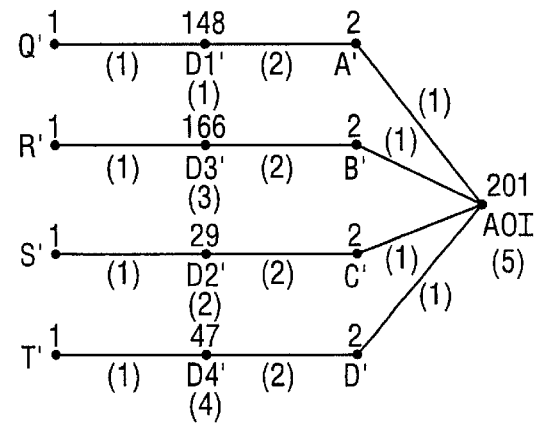
Figure 19C:
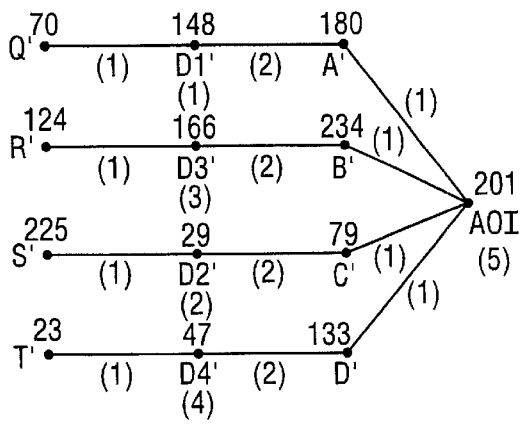
Figure 19D:
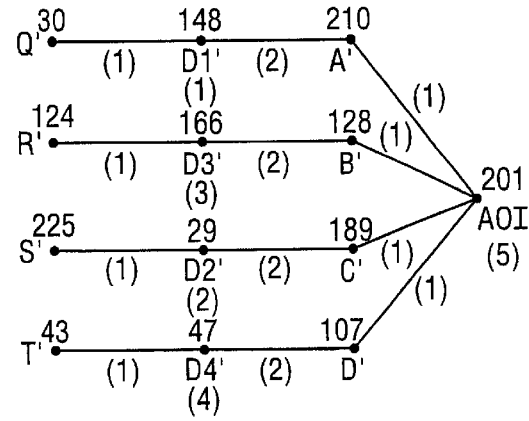

Referring now to FIGS. 19A–19D, a partitioning of the incorrect layout graph is provided, with the CSM being applied to the input nodes of the AOI (which are arranged as a vector) as a final step. This incorrect layout graph is not equivalent to the schematic because the following invalid permutation of A→A', B→C', C→B' and D→D' was applied. Here, in FIG. 19A the incorrect layout graph is initialized, in FIG. 19B a device partition is performed and in FIG. 19C a net partition is performed. The CSM is then applied to a vector of colors corresponding to the input nodes of the AOI in FIG. 19C which are arranged from A–D as: [180, 234, 79, 133]. Here, all graphs of FIGS. 17C, 18C and 19C exhibit the same set of node values, so there is no indication that the incorrect layout is incorrect. Yet, by the above CSM and a modulus of 256, a new vector of colors is generated as [210, 128, 189, 107] in FIG. 19D. The resulting vector of FIG. 19D is clearly not equivalent to the corresponding vector associated with the schematic graph of FIG. 17D or the layout graph of FIG. 18D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 180 \\ 234 \\ 79 \\ 133 \end{bmatrix} \Rightarrow \begin{bmatrix} 210 \\ 128 \\ 189 \\ 107 \end{bmatrix}$$

Accordingly, after application of the CSM, the correct layout and schematic still share a common set of node values, but the incorrect layout contains node values that do not appear in the schematic. Thus, by setting the classes of the related ports equal, the application of the CSM may distinguish between good and bad permutations.

Figure 20:
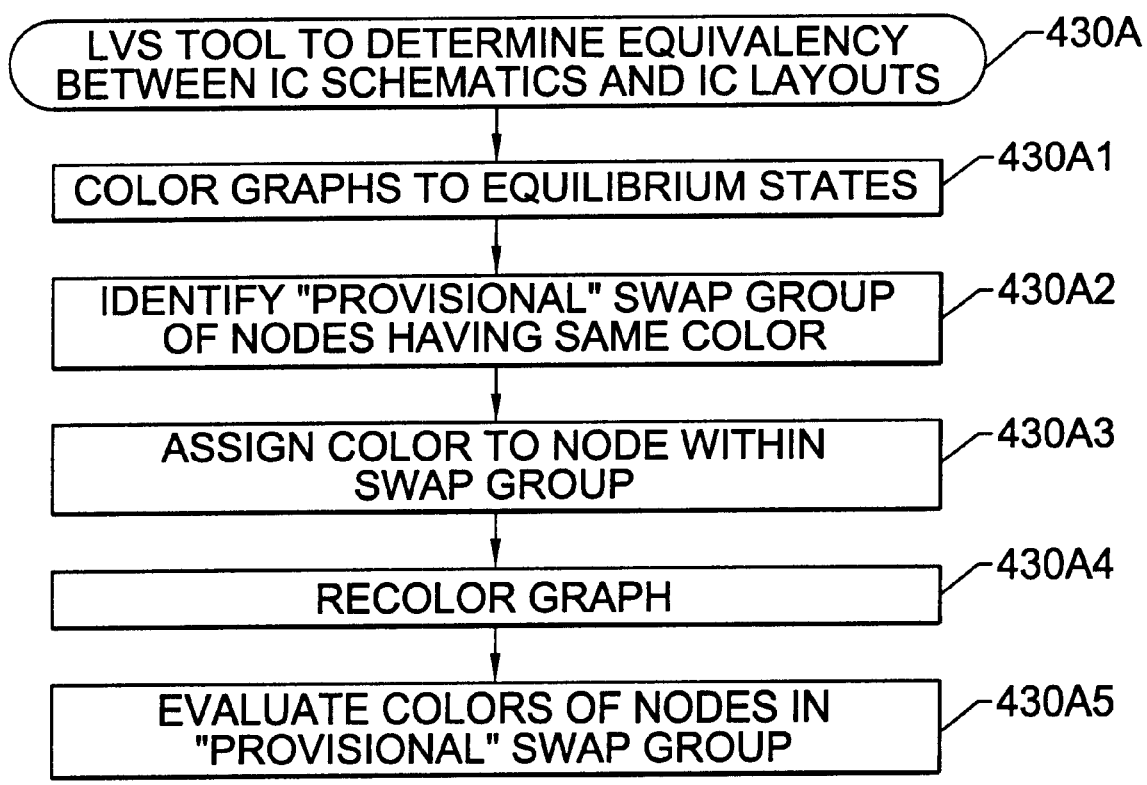
FIG. 20 is a flow diagram of operations performed by a layout versus schematic (LVS) comparison tool according to a first embodiment of the present invention.
Figure 21:
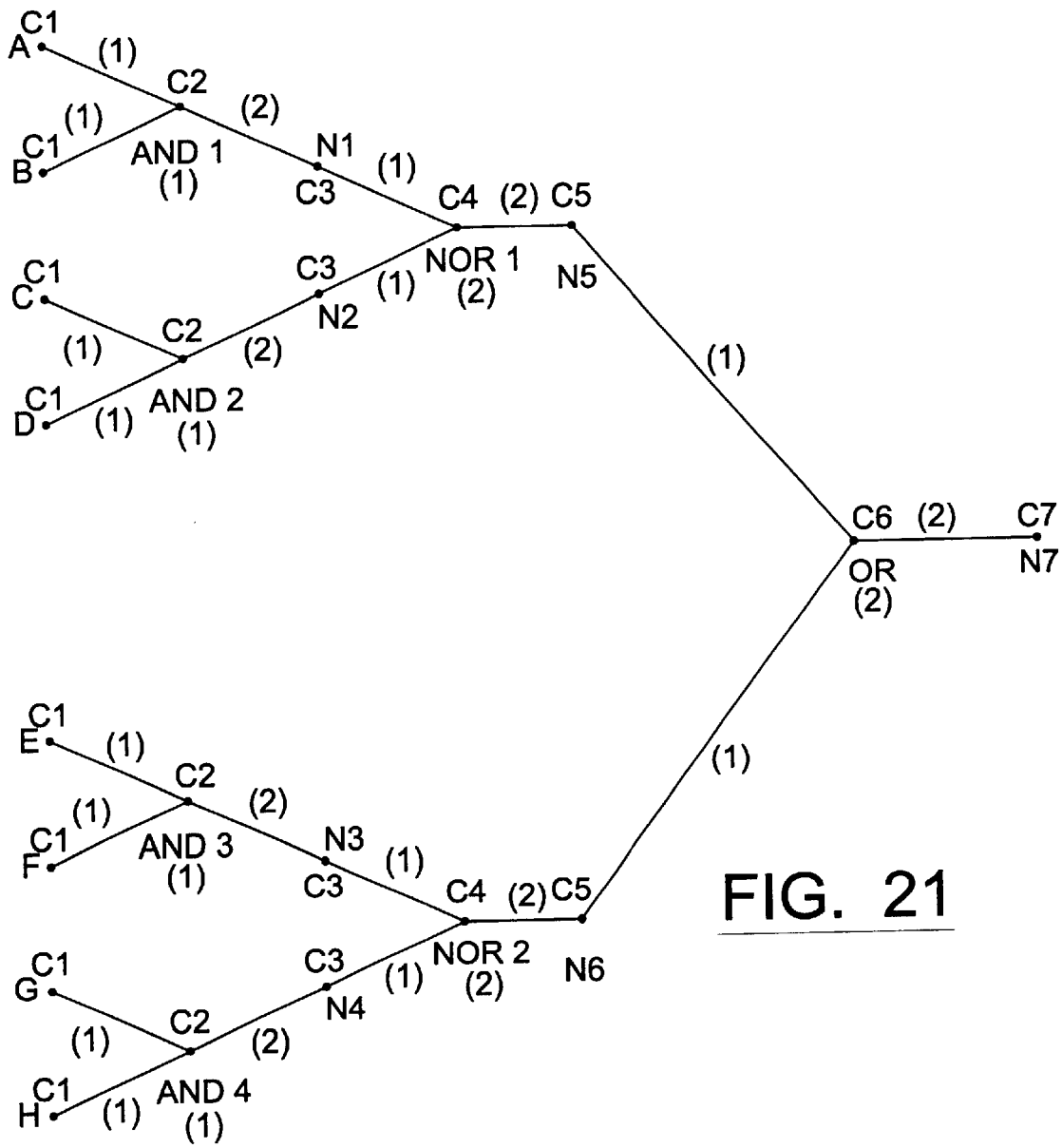
FIG. 21 illustrates operations to determine the presence of swappable nodes of a bipartite graph, in accordance with the embodiment of FIG. 20.
Figure 22:
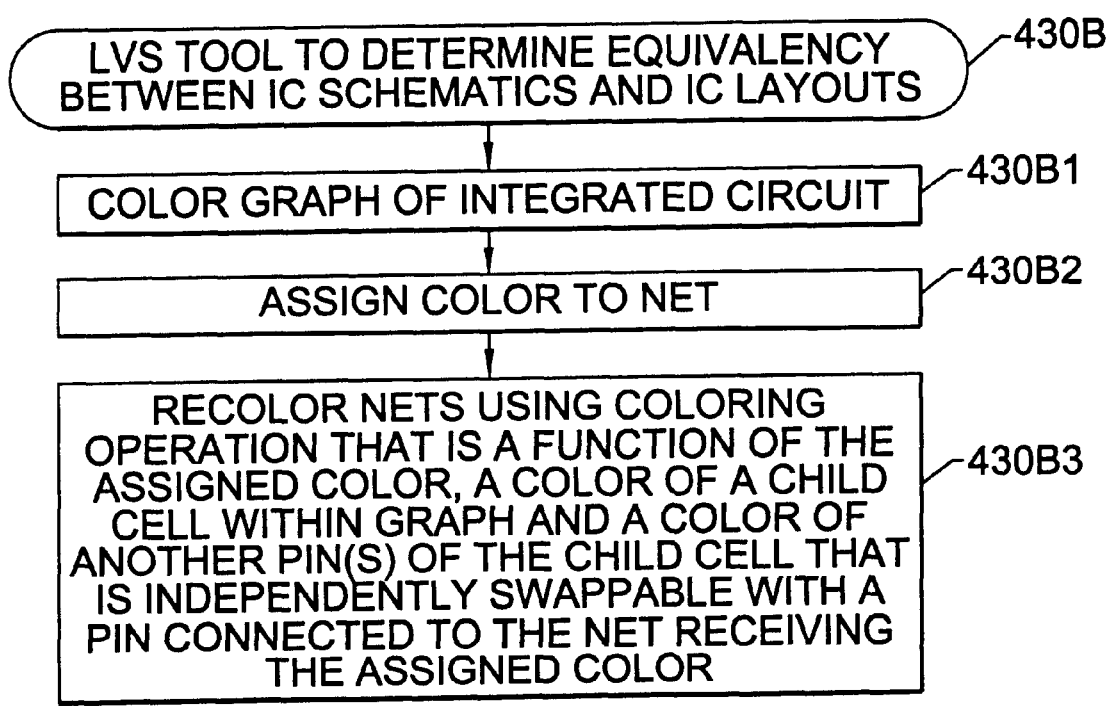
FIG. 22 is a flow diagram of operations performed by a layout versus schematic (LVS) comparison tool according to a second embodiment of the present invention.

Referring now to FIGS. 20–21, preferred operations performed by embodiments of a layout versus schematic (LVS) comparison tool 430A according to a first embodiment of the present invention will be described. These operations include coloring a graph of an integrated circuit to an equilibrium state and then identifying a "provisional" swap group of nodes having the same color within the colored graph, Blocks 430A1, 430A2. The colored graph may be a colored layout graph or a colored schematic graph of the integrated circuit. For example, as illustrated by FIG. 21, the colored graph may be a colored bipartite graph having both net and device nodes therein. This "provisional" swap group of nodes corresponds to pins of a device that may be swappable by virtue of the fact that the nodes associated with the pins have the same color after a graph coloring operation has been performed. A new (e.g., unique) color is then assigned to a node within the identified swap group, Block 430A3. An operation is then performed to recolor the layout graph (with the new colored node) until another equilibrium state has been achieved, Block 430A4. During this recoloring operation, the node receiving the assigned color may be held at the assigned color. This recoloring operation may include operations to repeatedly recolor nets and recolor devices in alternating sequence until an equilibrium colored state is achieved. These recoloring operations may be performed using conventional partitioning functions, as described above. At this point, a determination of whether the swap group of nodes are independently swappable can be made by evaluating whether all the nodes within the swap group, with the exception of the node that received the assigned color, have the same color, Block 430A5. If they do, then all the nodes within the swap group can be treated as independently swappable nodes.

The preferred LVS comparison tool 430A may also perform an operation of identifying at least one connected group within the swap group. This operation preferably comprises determining a first connected group of nodes as nodes within the swap group that are linked together (and to the node receiving the assigned color) by other nodes that have non-unique colors within the graph. Then, after the graph has been recolored to an equilibrium state, an operation can be performed to determine whether the nodes within the first connected group that did not receive the assigned color all have the same color. If so, these nodes and the assigned node within the first connected group can be treated as being independently swappable (i.e., as their own swap group), even if all the nodes within the "provisional" swap group are not independently swappable.

These preferred operations will now be described more fully hereinbelow with respect to FIG. 21 which illustrates a bipartite graph of a dual-AOI cell. As will be understood by those skilled in the art, this graphical illustration of a cell may be represented within a layout and/or schematic netlist of an integrated circuit using conventional techniques. The illustrated dual-AOI cell has eight (8) input ports A–H and comprises four (4) two-input AND gates, two (2) NOR gates and an OR gate, connected as illustrated. The node values C1–C7 represent the colors of the device and net nodes after the cell has been colored to an equilibrium state. Upon reaching an equilibrium colored state, the input ports A–H may be designated as having equal colors C1. The output OR gate is represented as having a color C6 which is unique to the cell. The numbers represented in parentheses represent potential pin and device classes and nodes N1–N7 represent internal or output nets of the dual-AOI cell having respective colors.

Based on the equivalent colors C1, input ports A–H are identified as exhibiting symmetry and as being potentially independently swappable as a result of this symmetry. In addition, nodes A–D can be identified as being within a first connected group since these nodes can be linked together by other nodes that have non-unique colors within the graph of the cell (i.e., nodes other than the device node OR which has a unique color). Similarly, nodes E–H can be identified as being in a second connected group since these nodes can be linked together by other nodes that have non-unique colors within the graph of the dual-AOI cell.

As illustrated by Block 430A3 of FIG. 20, once a provisional swap group of input nodes having the same color has been identified, a new color is assigned to a node within the swap group. This new color is preferably unique to all the nodes within the graph. Conventional recoloring operations may then be performed until a new equilibrium state has been achieved for the graphs. This graph recoloring operation may include performing a sequence of device and net recoloring operations, while simultaneously retaining the color of the assigned node as the assigned color. For example, in the event the input node H of the provisional swap group of nodes A–H is assigned the unique color C8 and a conventional graph coloring operation is performed, the input nodes A–D will retain their color as C1, the input nodes E–F will be recolored as C10 and input node G will be recolored as C9. A determination of whether the swap group of nodes are independently swappable can then be made by evaluating whether all the nodes A–G within the provisional swap group, with the exception of node H which received the assigned color, have the same color. Because nodes A–G do not all have the same color after the graph recoloring operation, nodes A–H can be confirmed as not being independently swappable. Moreover, because nodes E–G within the second connected group also do not have the same colors, the second connected group of nodes can be confirmed as not being independently swappable. Additional operations to assign a new color to a node within the first connected group of nodes A–D (followed by recoloring) can then be performed as described above to similarly confirm that nodes A–D are not independently swappable. Operations may then be performed to treat the dual-AOI cell of FIG. 21 as having unresolvable symmetries and flatten the cell within the next higher level of hierarchy.

Applying the operations described above with respect to FIGS. 20–21 to the simpler AOI cell of FIG. 10 will result in a determination that device node NOR 1 is a unique node and that nodes A–B within a first connected group are independently swappable and nodes C–D within a second connected group are independently swappable. These conclusions in combination with an original recognition that at least some degree of symmetry is present between nodes A–D (by virtue of the fact that these nodes will exhibit the same colors after an equilibrium colored state has been achieved), enables the first and second connected groups to be treated as having dependent swappability whereby if node A is swapped with node C, node B must be swapped with node D to maintain equivalency.

Referring now to FIGS. 22–26, preferred operations performed by a layout versus schematic (LVS) comparison tool 430B according to a second embodiment of the present invention will be described. These operations include coloring a schematic graph of a parent cell to obtain a first set of net colors for a first plurality of nets in the schematic graph, Block 430B1. Next, a new color is assigned to a first net in the first plurality of nets, Block 430B2. This first net is connected to a first pin of a child cell within the parent cell. The new assigned color is preferably unique to the other colors in the first set. A net recoloring operation is then performed, Block 430B3. This net recoloring operation preferably includes recoloring the first set of net colors by determining a new color for the first net using a coloring operation that is a function of the assigned color, a color of the child cell (i.e., device value of the child cell) and a color of each of the first plurality of nets that are electrically connected to pins of the child cell that are independently swappable with the first pin. In particular, the recoloring operation preferably comprises determining effective "colors" associated with each of the pins of the child cell, using the preferred coloring operation, and determining a new color for the first net based on the effective "colors" of each of the pins in the child cell that are connected to the first net. For example, the new color for the first net may be determined by computing a sum of the effective "colors" of each of the pins in the child cell that are connected to the first net, after the recoloring operation has been performed. As described herein, pins (i.e., ports) of a child cell will be treated as having effective "colors", where the "color" or each pin corresponds to the color of the net that is connected to the pin. Accordingly, even if three swappable pins of a child cell (e.g., AOI cell) are connected together by a single net and therefore would be represented in a layout or schematic graph by a single node corresponding to the net, these pins will be treated herein for purposes of coloring as each having effective "colors" which may during the course of recoloring be unique.

Figure 23:
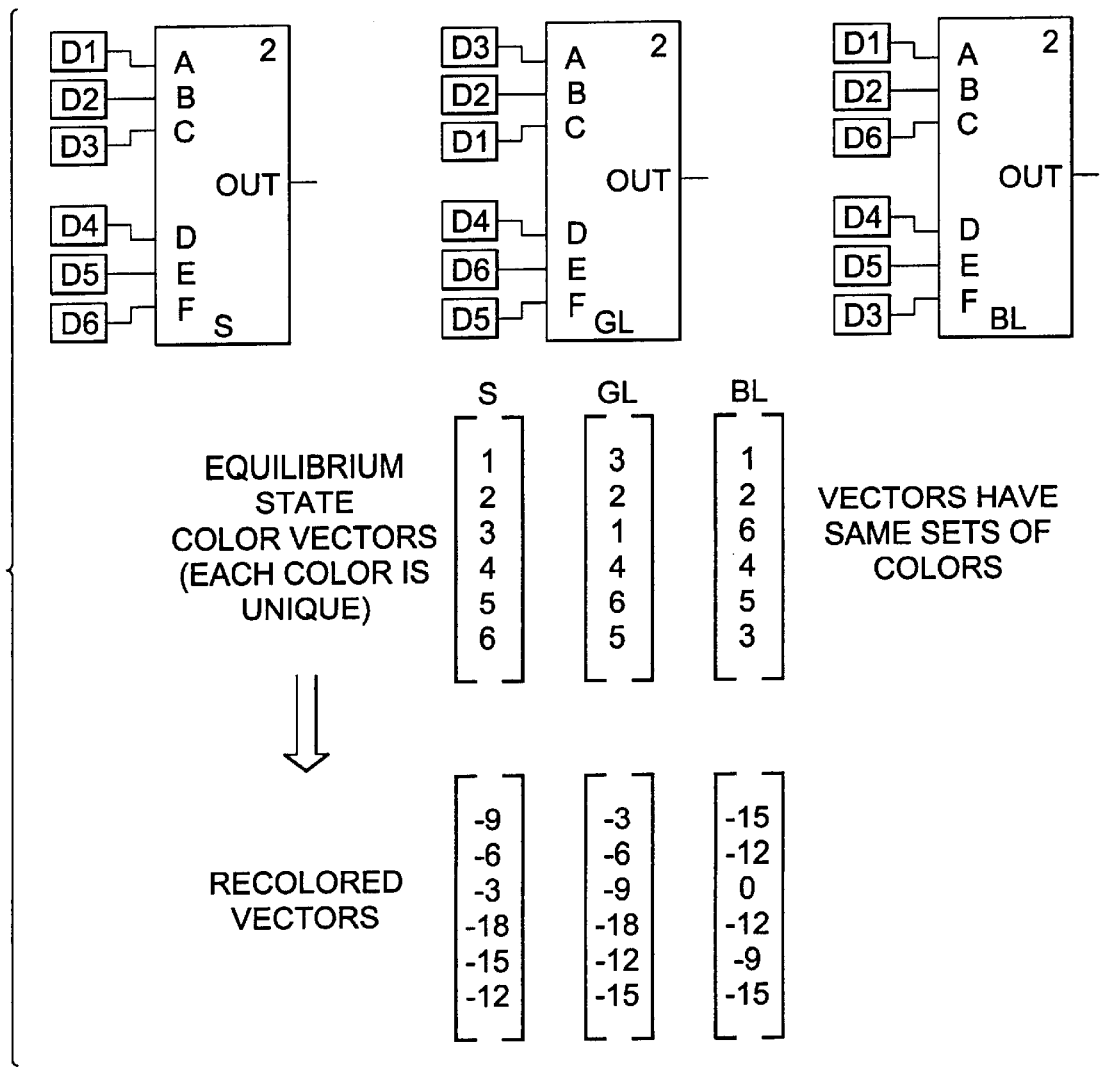
FIG. 23 illustrates application of preferred coloring operations to a first exemplary circuit.

The operations performed by the LVS tool 430B of the present invention will now be described more fully with respect to the parent cells illustrated by FIGS. 23–27. For example, FIG. 23 illustrates a plurality of exemplary parent cells. The labels "S", GL" and "BL" refer to schematic, good layout and bad layout, respectively. As illustrated, each of these parent cells has a six-input AOI child cell and six discrete devices D1–D6 therein. Using the operations described above with respect to FIGS. 10 and 20–21 at the child level, pins A–C of the AOI child cell (which represent three input pins of an AND logic gate) can be treated as being independently swappable with each other and pins D–F can also be treated as being independently swappable with each other. Pins A–C are also dependently swappable with pins D–F. Each of the six devices D1–D6 is connected to a respective pin of the AOI child cell by a respective net. These hierarchical integrated circuit schematic and layout designs (containing the parent cell, the devices, the AOI child cell, nets, etc.) are preferably described by schematic and layout netlist files and may be represented within these netlist files as schematic and layout graphs (e.g., bipartite graphs). The schematic and layout graphs corresponding to the respective designs may be colored until an equilibrium colored state is achieved. For purposes of illustration, the nets connecting devices D1–D6 to input pins A–F may receive respective colors that are different from each other. In particular, the input nodes or pins A–F of the schematic AOI cell (having a device value (i.e., color) equal to 2) may receive the distinct colors $\{1,2,3,4,5,6\}$. Similarly, the pins A–F of the good layout parent cell and the bad layout parent cell may receive the distinct colors $\{3,2,1,4,6,5\}$ and $\{1,2,6,4,5,3\}$. In contrast to the examples described below, the determination of distinct net colors typically precludes the need to assign a new net color prior to performing a net recoloring operation. FIG. 23 illustrates these colors as respective equivalent pin vectors or sets S, GL and BL. Because the vectors are equivalent, the bad layout parent cell BL cannot be readily distinguished at this stage from the good layout parent cell GL (relative to the parent cell S). However, by performing a preferred net recoloring operation on each of the color vectors, the good layout GL can be distinguished from the bad layout BL. With respect to the schematic color vector S, the new color for pin A is determined using the following expression:

NPC=OPC−DV(ΣColors of Other Independently Swappable Pins)

where NPC represents the new pin color, OPC represents the old pin color and DV represents the device value (e.g., color) of the corresponding child cell. This preferred expression can use requires significantly less computational expense than a prior art technique of determining updated node colors of a cell using a color symmetrizing matrix (CSM) and the following expression:

(NPC)=(OPC)+(CSM)(OPC)DV

Moreover, when recoloring a particular pin of a child cell, for example, the preferred expression does not require a determination of a product of the device value and a color of a pin that is merely dependently swappable with the pin being recolored. Thus, when evaluating child cells having both independently swappable pins and dependently swappable pins (e.g., a cell having AOI-type pin symmetry), a pin may be recolored by evaluating the colors of independently swappable pins but not the colors of the dependently swappable pins. When evaluating child cells having symmetric pins that are all independently swappable (e.g., a multi-input NAND gate), the preferred expression does not require the generation of a CSM and the computational expense of determining a product of the CSM and a vector of node colors.

Based on the above preferred expression, the pins of the schematic graph (and the separate nets connected to each pin) can be recolored as:

new color of pin A=1−2(2+3)=−9 new color of pin B=2−2(1+3)=−6 new color of pin C=3−2(1+2)=−3 new color of pin D=4−2(5+6)=−18 new color of pin E=5−2(4+6)=−15 new color of pin F=6−2(4+5)=−12

Performing this net recoloring operation on the color vectors for the good layout GL and bad layout BL readily illustrates an inequality between the new color vector for the bad layout BL and the new color vector for the schematic S, as illustrated by FIG. 23. Based on this inequality, the bad layout can be detected.

Figure 24:
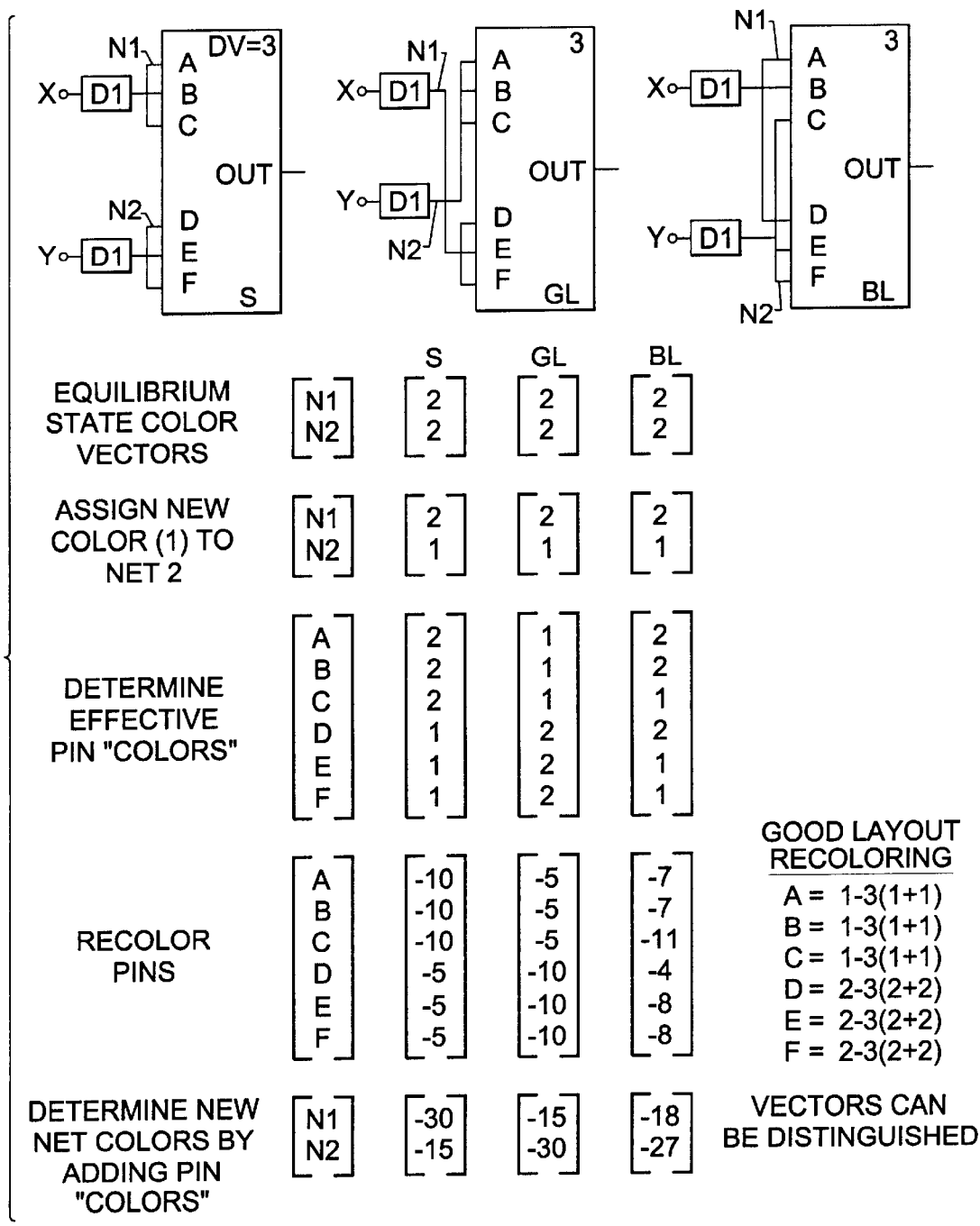
FIG. 24 illustrates application of the coloring operations of FIG. 22 to a second exemplary circuit.

Referring now to FIG. 24, another exemplary parent cell design is provided having a pair of identical devices D1 which drive inputs of a six-input AOI child cell. Identical equilibrium state color vectors for nets N1 and N2 in the schematic, good layout and bad layout can be achieved using conventional graph coloring techniques. Identical device values (DV) are also present by virtue of the symmetry of the pin connections to the devices D1. A new color (1) is then assigned to net N2 in the schematic, good layout and bad layout vectors. Alternatively, the new color may have been assigned to net N1. This assignment step is necessary because at least two nets identified by each vector have the same colors. Preferably, only a net having the same color as another net within a vector should be assigned a new color. Vectors illustrating effective pin "colors" may then be determined readily by expanding the net vectors, as illustrated. The effective colors of the pins are then modified using a recoloring operation that is a function of the device value of the AOI cell and the colors of the other pins that are independently swappable with the pin being recolored (but is independent of the colors of pins that are dependently swappable). A new net color is then determined for each net by adding the colors of all pins connected to a respective net together to obtain a sum. As illustrated, the new net colors for nets N1 and N2 readily identify the bad layout as being incorrect notwithstanding the fact that the initial coloring operations failed to identify a difference between the equilibrium state net color vectors.

Figure 25:
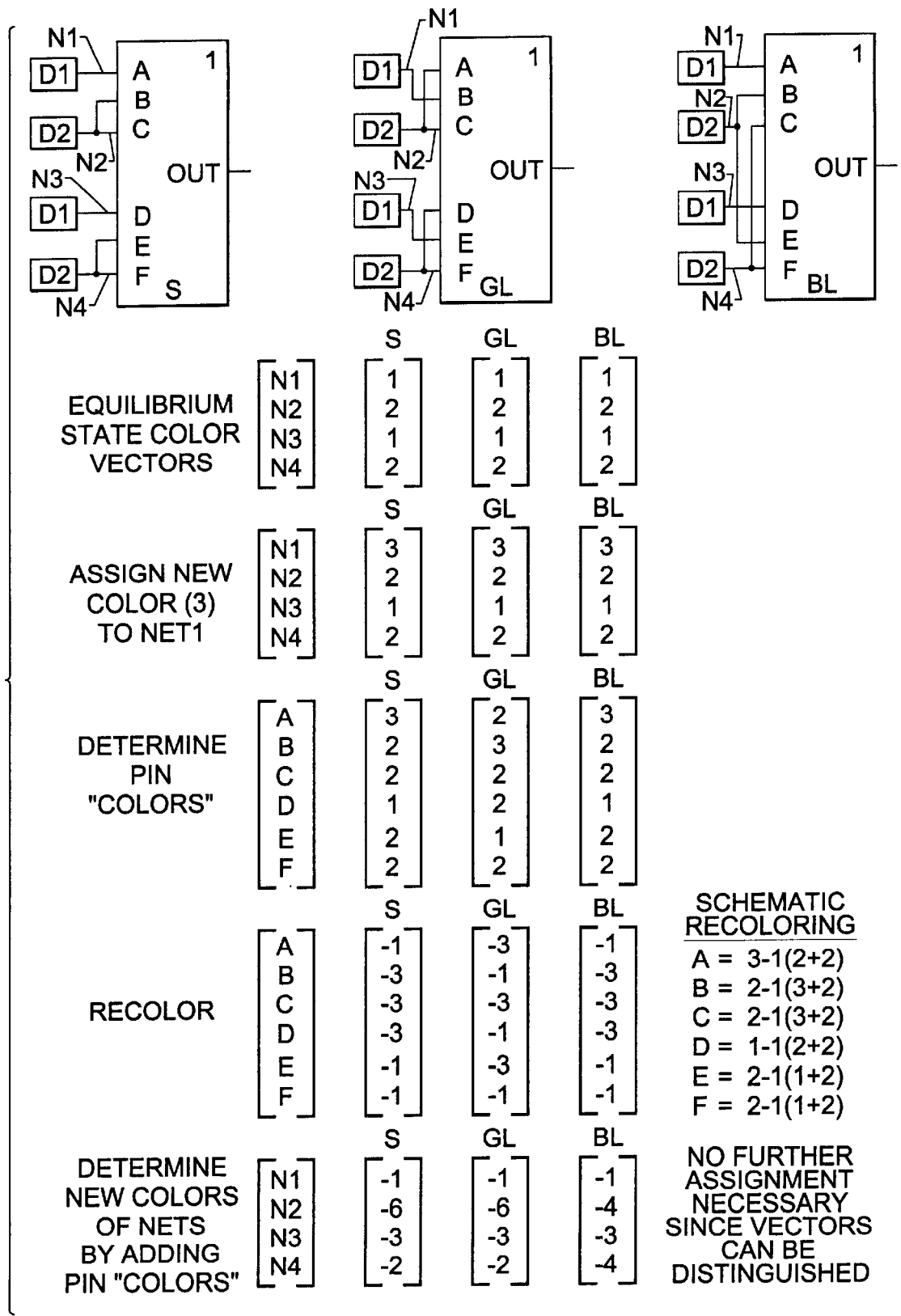
FIG. 25 illustrates application of preferred coloring operations to a third exemplary circuit.

Referring now to FIG. 25, another exemplary parent cell design is provided having two pairs of identical devices D1 and D2 which drive inputs of a six-input AOI child cell. The equilibrium state color vectors for nets N1–N4 in the schematic, good layout and bad layout parent cells are identical with nets N1 and N3 having identical colors and nets N2 and N4 having identical colors. A new color (3) may then be assigned to net N1 in the parent cells. Effective pin colors are then determined by expanding the net vectors, as illustrated. The preferred recoloring operation is then performed on each of the pins. The new net vectors are then determined by adding back the pin colors. For example, the new color for nets N1 are determined by looking at pin A (−1) in the schematic, pin B (−1) in the good layout and pin A (−1) in the bad layout. The new color for nets N2 are determined by adding the colors of pins B and C in the schematic, adding the colors of pins A and C in the good layout and adding the colors of pins B and E in the bad layout. The resulting net vectors illustrate the presence of the bad layout since the color vector for the bad layout does not match the color vector for the schematic. Moreover, no further net assignments are required between the schematic and good layout since the colors of the nets illustrated by the color vector for the schematic do not overlap (i.e., the colors of each of the nets N1–N4 in the schematic are unique).

Figures 1, 26:
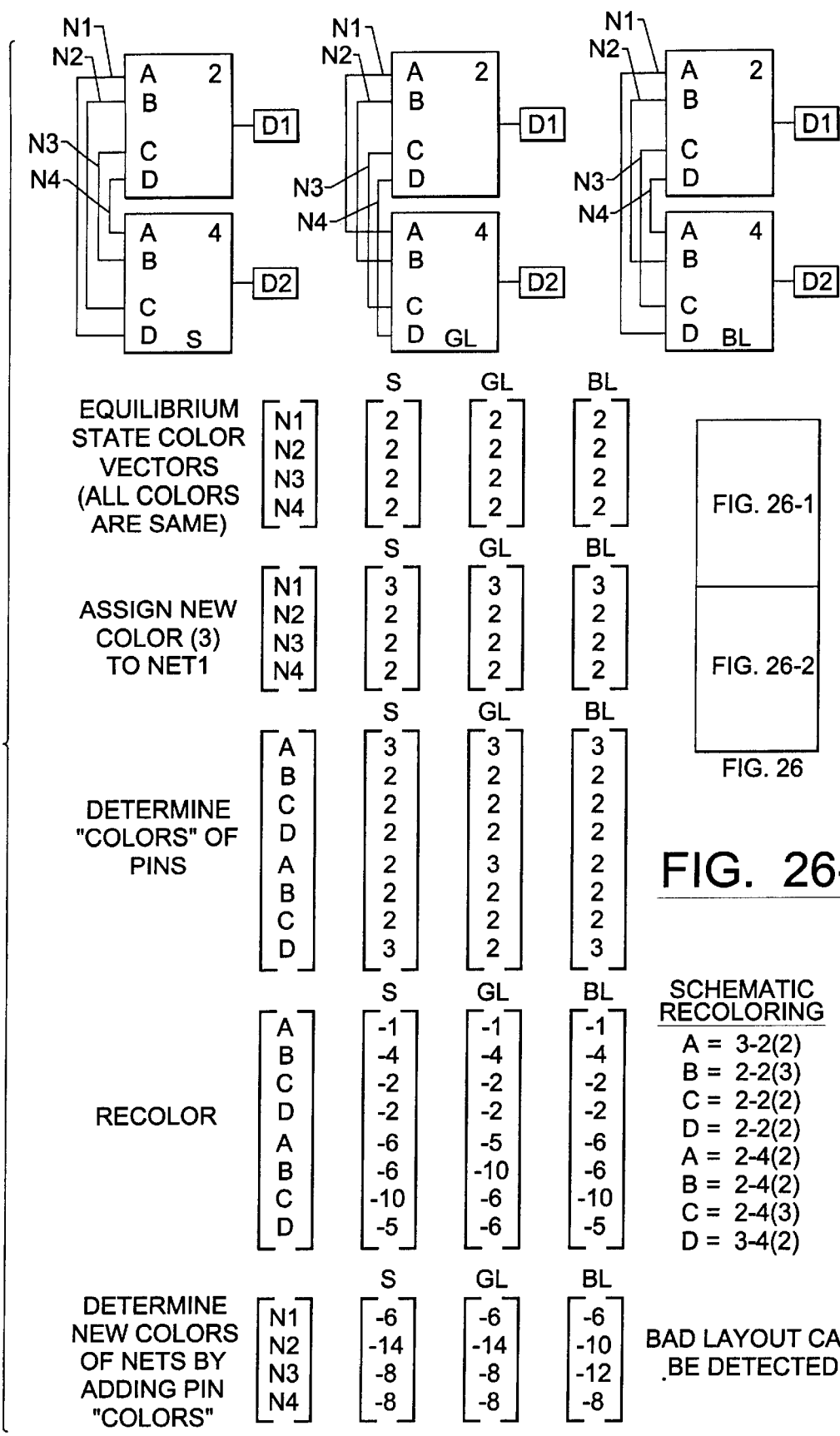
FIG. 26 illustrates application of preferred coloring operations to a fourth exemplary circuit.

Referring now to FIG. 26, an exemplary parent cell design is provided having two 4-input AOI child cells and two devices D1 and D2. Because the two devices are different, the AOI child cells are illustrated as having different device values (i.e., different colors on a graph). The original equilibrium state color vectors for nets N1–N4 in the schematic, good layout and bad layout parent cells are illustrated as being identical with all nets having the same original colors. An assignment of a new color (3) to net N1 is then made, as illustrated. This net assignment may be arbitrary. To limit unnecessary computational expense, a net receiving an assigned color may retain its assigned color throughout a net coloring operation. The effective colors of the pins are then determined. In particular, the effective pin colors are used along with the respective AOI device colors during a preferred pin recoloring operation. This preferred pin coloring operation may be performed as a discrete numerical operation within a net coloring operation. The pin coloring operation is also a function of the device value of the corresponding child cell and the colors of the other pins that are independently swappable with the pin being recolored. This pin coloring operation is preferably independent of the colors of other pins that are dependently swappable with the pin being recolored. The new colors of the nets may then be determined by adding back the new pin colors determined by the pin recoloring operation. As illustrated, the net color vector associated with the bad layout can be distinguished from the net color vector associated with the schematic. Nonetheless, because the net color vectors for the schematic and good layout still have duplicate colors (−8), a new net color (10) is assigned to net N4 (or, alternatively, net N3). Next, the operations of determining pin colors and then recoloring the pins are repeated. The recolored pins are then combined, if necessary, to determine the final net colors. As illustrated, the net colors are unique and the color vectors are identical. This result confirms the equivalency between the schematic of the parent cell and the good layout of the parent cell.

Figures 1, 34:
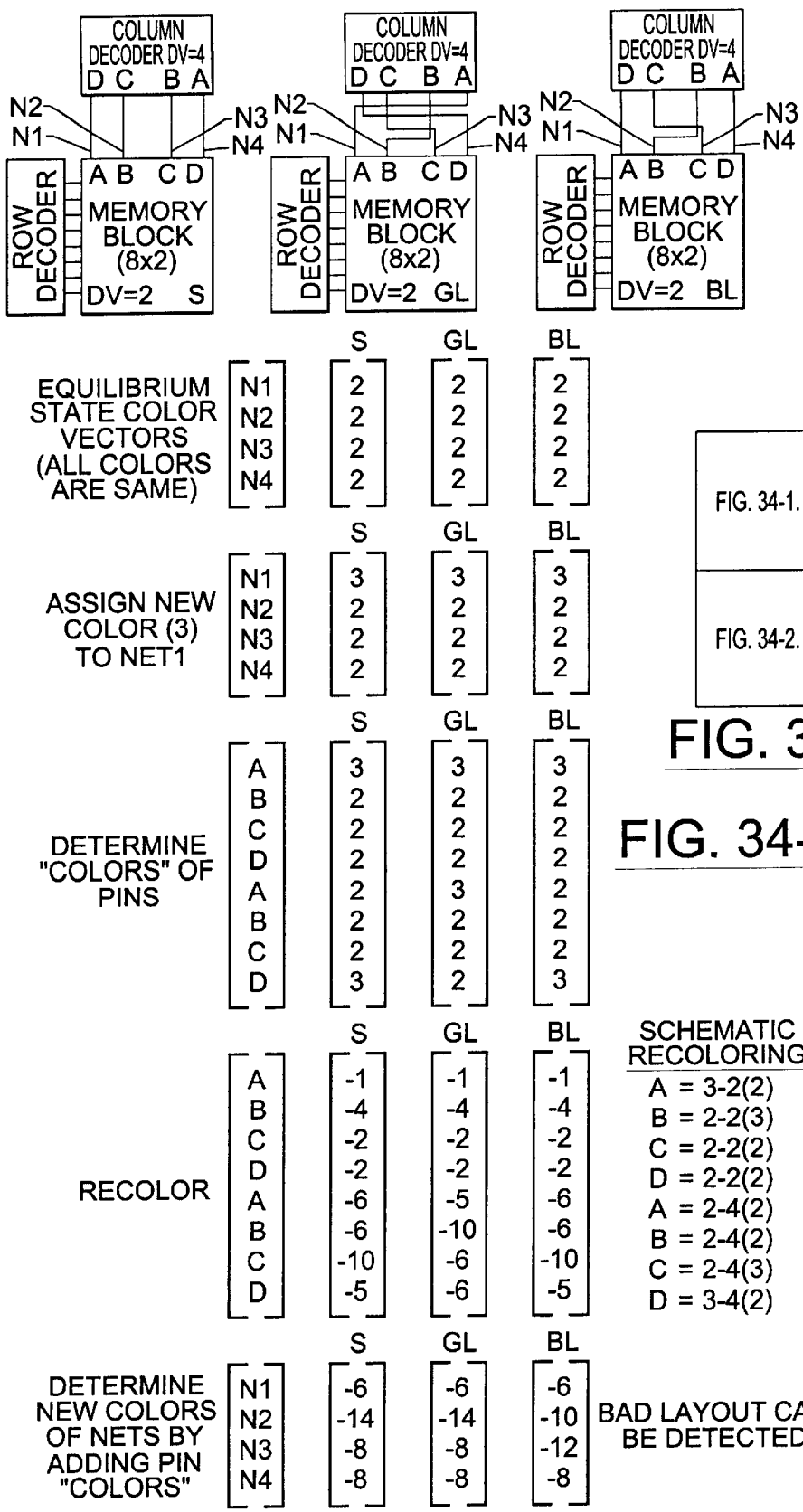
FIG. 34 illustrates application of preferred coloring operations to an exemplary memory device.

As illustrated by FIG. 34, the example of FIG. 26 can be applied to an integrated circuit memory device comprising a memory block (e.g., SRAM memory block), a row decoder connected by respective word lines to the memory block and a column decoder connected by respective pairs of bit lines to the memory block. Accordingly, the recoloring operations described with respect to FIG. 26 also apply to the example of FIG. 34 when determining a match between a good layout and schematic of an integrated circuit memory device. Like the devices of FIG. 26, the column decoder of FIG. 34 is illustrated as having a device value of four (4) and the memory block is illustrated as having a device value of two (2). As will be understood by those skilled in the art, the pins of the memory block that represent word line connections are independently swappable with each other. Moreover, for a memory block comprising SRAM cells and pairs of complementary bit lines associated with each column of SRAM cells, each first pin of the memory block that represents a true bit line connection is independently swappable with another corresponding second pin that represents a complementary bit line connection. Pairs of first and second pins corresponding to a complementary pair of bit lines are also dependently swappable with each of the other pairs of pins corresponding to the other pairs of bit lines in the memory block. Thus, pins A and B of the memory block of FIG. 34 represent connections to a first pair of complementary bit lines that are independently swappable with each other and pins C and D represent connections to a second pair of complementary bit lines that are independently swappable with each other.

Figures 1, 27:
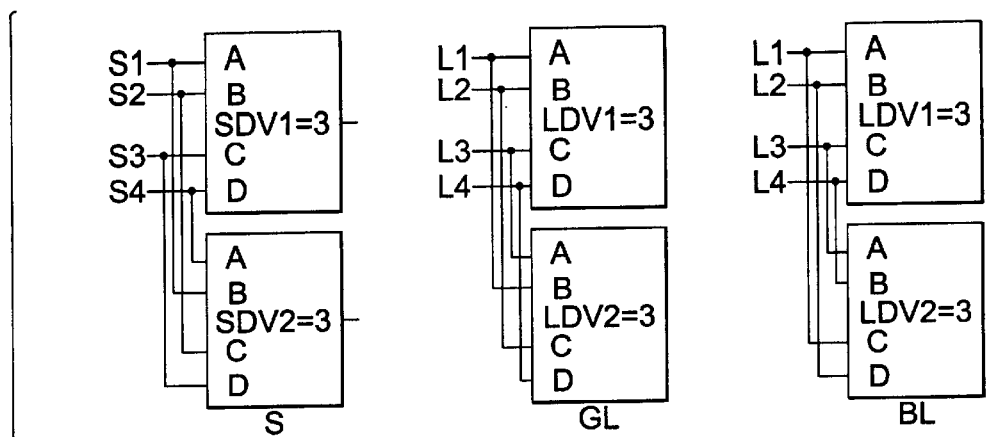
FIG. 27 illustrates application of preferred coloring operations to a fifth exemplary circuit.

Referring now to FIG. 27, another exemplary parent cell design is provided having two 4-input AOI child cells. As illustrated, the schematic and layout devices values (SDV1, SDV2, LDV1, LDV2) for the AOI child cells are initially identical. The original equilibrium state color vectors for nets S1–S4 in the schematic parent cell and nets L1–L4 in the good layout and bad layout parent cells are illustrated as being identical with all nets having the same original colors (5). An assignment of a new unique color (7) can be made arbitrarily to net S1 in the schematic and nets L3 in the good layout and bad layout, as illustrated. To limit unnecessary computational expense, a net receiving an assigned color retains its assigned color throughout a net coloring operation.

Effective pin colors are then determined for the pins of the AOI child cells in the schematic and layouts. Using the identical device values of (3), the pins of the AOI child cells are recolored. New net colors for nets S2–S4, L1–L2 and L4 are then determined by combining the pin colors. For example, since net S2 of the schematic is connected to pin B of the top AOI cell and pin C of the bottom AOI cell, the new color for net S2=(−16)+(−10). The determination of the new net colors reveals a lack of equivalency between the schematic and the bad layout. The determination of the new net colors also reveals two nets in the schematic and two nets in the good layout that have identical colors. Accordingly, another arbitrary net assignment is made to net S2 and net L2. For purposes of illustration only these nets may receive a new net color of 3 (although a color that is unique to the entire schematic and layout graphs is preferred). Based on these new net assignments, updated pin colors are determined for the pins of the top and bottom AOI child cells. The updated pin colors are then recolored using the illustrated operations as applied to the good layout. New net colors for nets S3 and S4 in the schematic and nets L2 and L4 in the layout are then determined. These new colors readily reveal an equivalence between the schematic and good layout. No further net assignments are necessary since each of the colors of the schematic net vector are unique. Moreover, because the last set of pin colors reveal an equivalency between the top AOI cell in the schematic and the bottom AOI cell in the good layout, operations are then performed to prevent an incorrect mapping of these child cells in the schematic and good layout during subsequent device coloring operations. These operations preferably include determining a new device color for the top AOI cell in the schematic by evaluating a product of the symmetric pin colors of pins A–D. As illustrated, the new device values for the AOI cells in the schematic and layout can be determined using the following relationship: New Device Value=Old Device Value+Π(Colors of Symmetric Pins of Cell). Thus, $SDV1_{new}=3+(-2)(-18)(58)(34)=70,995$ $SDV2_{new}=3+(-47)(85)(63)(-29)=7,298,868$ $LDV1_{new}=3+(63)(-29)(85)(-47)=7,298,868$ $LDV2_{new}=3+(-2)(-18)(58)(34)=70,995$ As determined by the inventors herein, merely determining an algebraic sum of the colors of the symmetric pins will not distinguish the AOI cells during subsequent coloring operations since:

$(-2)+(-18)+(58)+(34)=72=(-47)+(85)+(63)+(-29)$

Figure 28:
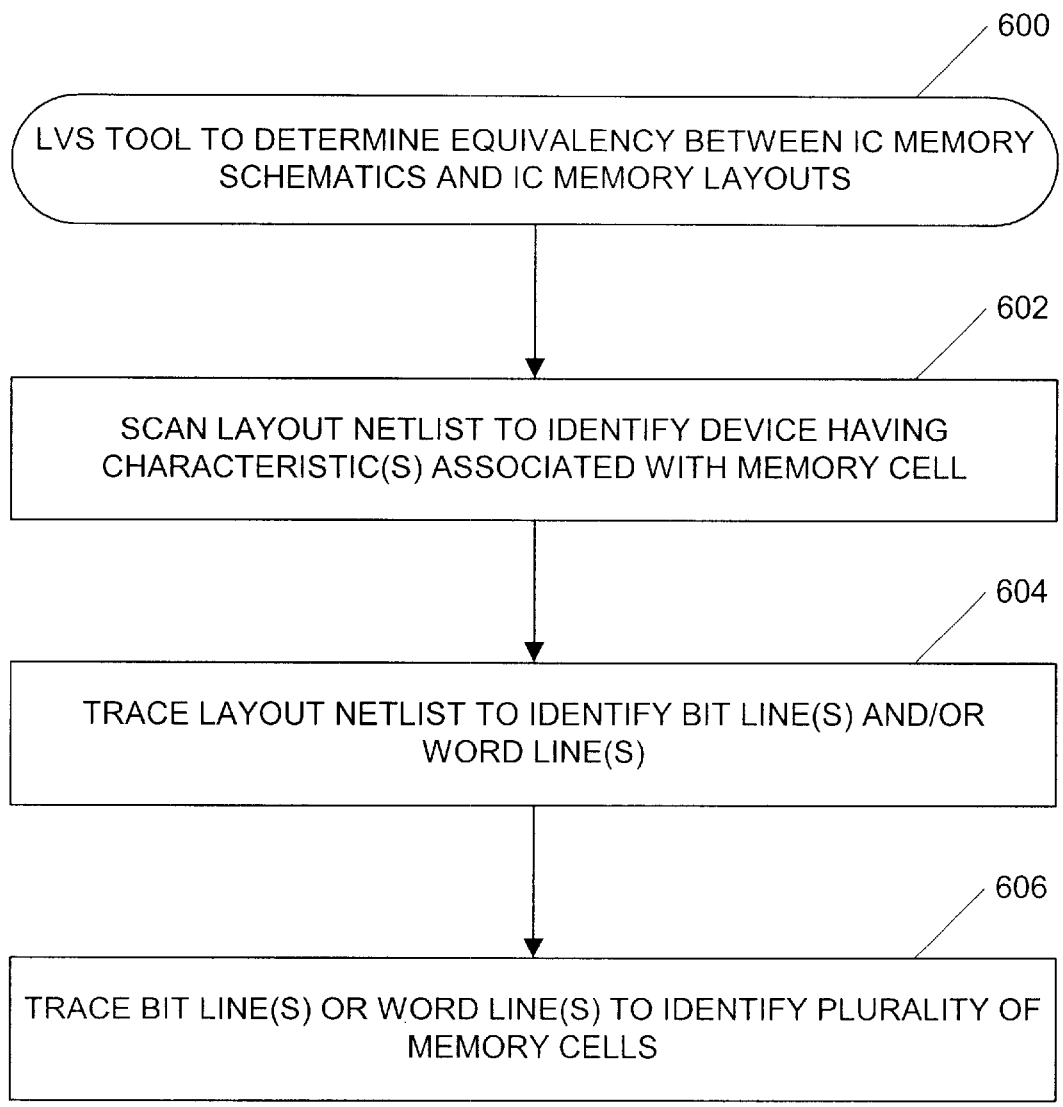
FIG. 28 is a flow diagram of preferred operations performed by a layout versus schematic (LVS) comparison tool according to another embodiment of the present invention.

Still further embodiments of the present invention include operations 600 to perform layout versus schematic comparison of integrated circuits having memory cells and non-memory cells therein, as illustrated by the flow diagram of FIG. 28. These operations are particularly useful when an integrated circuit layout includes one or more arrays of memory cells (i.e., bit cells) that are identified at a transistor level in the layout netlist and typically not at a higher user-defined cell level. Such operations include scanning a layout netlist of the integrated circuit at the transistor level to identify a first device therein that has an identifiable characteristic associated with the plurality of memory cells relative to the plurality of non-memory cells, Block 602. Upon detection of the identifiable characteristic, the layout netlist of a first memory cell containing the first device is traced in order to identify a first bit line and/or a first word line therein that is electrically coupled to the first memory cell, Block 604. This tracing operation preferably comprises tracing a netlist path extending from the first device to a first bit line or a first word line electrically connected to the first memory cell. This netlist path may include a path defined by one or more nets and devices connected together and preferably connected between the first device and the first bit line (or first word line). The first bit line and/or first word line is then traced locally to identify a plurality of additional memory cells electrically coupled thereto along a column or row, Block 606. Additional bit lines and words lines that are connected to these identified memory cells can also be traced in a similar manner to identify a plurality of rows and columns of memory cells in a memory array block.

Operations may also be performed to determine one-to-one correspondence between an integrated circuit schematic netlist and the integrated circuit layout netlist by treating the plurality of identified memory cells in the layout netlist as a memory array block (or child cell containing a memory array block) and treating the bit lines and word lines as input pins to the block memory array that may be independently swappable. In particular, the word lines are typically independently swappable and the bit lines may be independently swappable as a group or independently swappable in pairs with each pair including a true and complementary bit line (BL, /BL).

The operations to trace the first bit line or the first word line may include tracing a first word line electrically coupled to the first memory cell to identify a first row of memory cells and then tracing a second bit line electrically coupled to a second memory cell in the first row of memory cells to identify a first column of memory cells. Alternatively, the operations to trace the first bit line or the first word line may include tracing a first word line electrically coupled to the first memory cell to identify a first row of memory cells and then tracing the first bit line electrically coupled to the first memory cell to identify a first column of memory cells. Bit lines and word lines connected to other memory cells in the identified rows and columns may also be traced to identify additional memory cells.

Figure 29A:
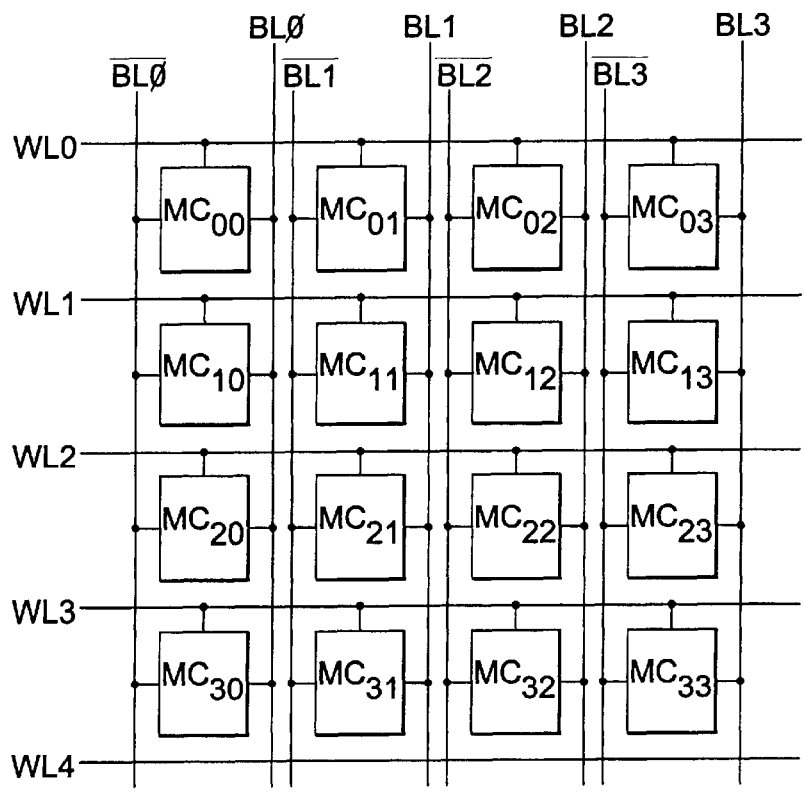
FIG. 29A is a block schematic view of a portion of a conventional memory cell array containing sixteen (16) memory cells.
Figure 29B:
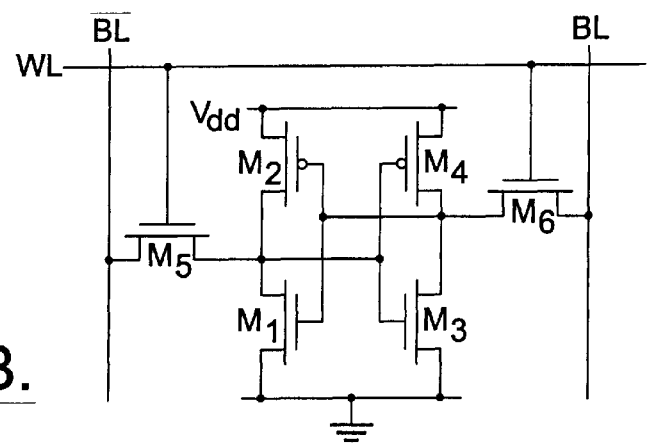
FIG. 29B is an electrical schematic view of a conventional static random access memory (SRAM) cell that may be used in the memory array of FIG. 29A.

In the event the integrated circuit comprises SRAM cells, the operation to scan the layout netlist may include scanning devices in the layout netlist to identify a first field effect transistor having a gate electrode electrically connected to a source/drain region of a second field effect transistor. The scanning operation may then be continued by scanning the second field effect transistor to determine if a gate electrode of the second field effect transistor is electrically connected to a source/drain region of the first field effect transistor. Identification of the device as an SRAM bit cell is at least preliminarily confirmed if both these conditions are met. These operations are described in more detail by reference to FIGS. 29A–29B, where FIG. 29A is a block schematic view of a portion of a conventional memory array comprising sixteen (16) memory cells ($MC_{00}$–$MC_{33}$) arranged in four rows and four columns and FIG. 29B is an electrical schematic of a conventional SRAM cell that may constitute a memory cell illustrated by FIG. 29A. As illustrated by FIG. 29A, each memory cell is connected to a respective word line (WL) and a respective pair of complementary bit lines (BL and /BL). The SRAM cell of FIG. 29A comprises six transistors (M1–M6). A preferred identifiable characteristic of the SRAM cell of FIG. 29A is the first cross-connection between transistors M2 and M4 (i.e., the connection between the gate of PMOS transistor M2 and the drain of PMOS transistor M4 and the connection between the gate of PMOS transistor M4 and the drain of PMOS transistor M2). A similar cross-connection is also present between transistors M1 and M3. As will be understood by those skilled in the art, such cross-connections are not necessarily attributable to only memory cells (e.g., SRAM cells) within an integrated circuit design containing memory cells and non-memory cells. Nonetheless, an identification of such cross-connections in devices within an integrated circuit design can be used to filter out those devices that have a much higher likelihood of being part of a memory cell. Subsequent local netlist tracing operations can then be performed to verify the presence of a memory cell.

Referring again to FIG. 29B, preferred operations to determine equivalency between an integrated circuit schematic containing SRAM memory cells and an integrated circuit layout may include scanning the layout netlist to identify a first device(s) therein that has associated therewith the above-described cross-connection. For purposes of illustration only, this scanning operation may result in the identification of PMOS transistors M2 and M4 within an SRAM memory cell located within a second row and first column of a memory array (e.g., $MC_{10}$ of FIG. 29A), for example. Once a first device(s) has been identified, at least a portion of the netlist surrounding and/or connected to the first device is preferably traced in order to identify a first bit line and/or first word line that is electrically connected to a memory cell containing the first device. This tracing operation may be performed in an efficient manner based on a priori knowledge of the construction of the SRAM cell used in the schematic and layout. For example, a word line may be identified within the netlist as a line connecting the gates of NMOS access transistors M5 and M6 together. Alternatively, a pair of bit lines may be identified as lines connected to the drain/source terminals of the access transistors M5 and M6. This tracing operation may also include tracing the layout netlist around and about the first device to confirm its inclusion within an SRAM cell as opposed to a non-memory cell. Thus, a netlist tracing operation may include identifying other ones of the MOS transistors that are connected to the identified device in a manner consistent with an SRAM cell.

A subsequent "global" netlist tracing operation may then be performed once a bit line(s) and/or word line has been identified. This subsequent tracing operation may include tracing the bit line and/or word line in order to identify a memory cell or a plurality of memory cells within the same row and/or column as the originally identified memory cell. For example, tracing the word line associated with the originally identified memory cell may result in the identification of a plurality of memory cells within the common row. Then, a tracing operation may be performed to identify a bit line(s) connected to one of the identified memory cells within the common row. This identified bit line may then be traced to identify a plurality of memory cells within a common column. Combinations of these word line and bit line tracing operations (performed after an initial memory cell has been identified) may be performed to determine the extent of a block array of memory cells originally defined by the layout designer at a transistor level.

Figure 30A:
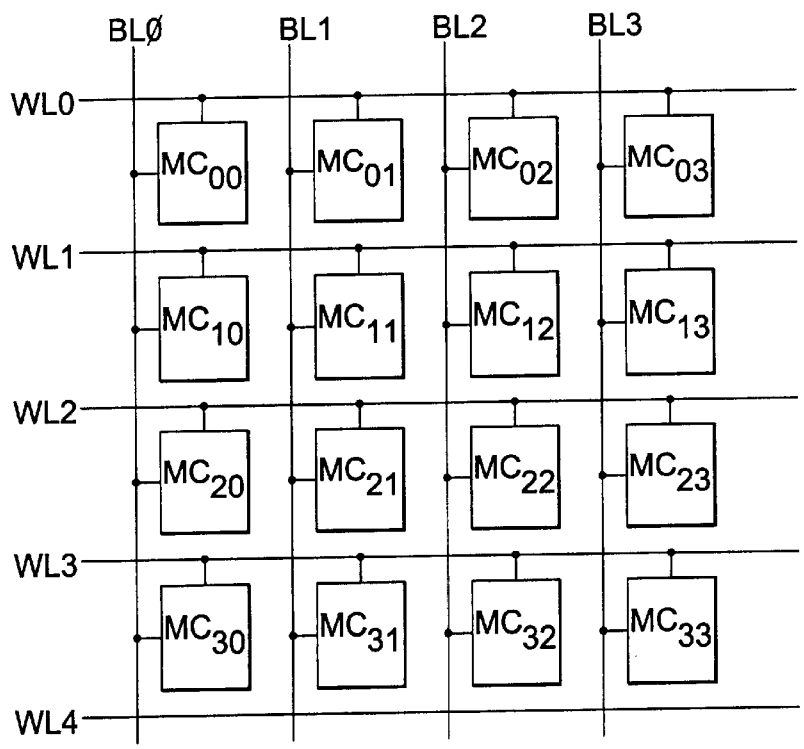
FIG. 30A is a block schematic view of a portion of a conventional memory cell array containing sixteen (16) memory cells.
Figure 30B:
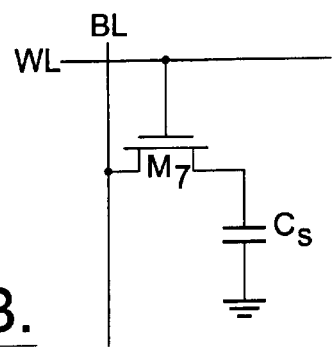
FIG. 30B is an electrical schematic view of a conventional dynamic random access memory (DRAM) cell that may be used in the memory array of FIG. 30A.

Referring now to FIGS. 30A–30B, operations similar to those described above with respect to FIGS. 28 and 29A–29B may also be performed to identify a block array of DRAM memory cells originally defined by the layout designer at a transistor level (instead of being defined by a user at a higher child cell level). In particular, FIG. 30A illustrates a portion of a DRAM memory array containing sixteen (16) memory cells and FIG. 30B illustrates an exemplary bit cell. This bit cell comprises an access transistor M7 and a storage capacitor $C_S$. Based on this bit cell configuration, the identifiable characteristic may be the connection between an electrode of a storage capacitor and a source/drain region of an MOS transistor since such a connection is typically not associated with non-memory devices. Accordingly, the operation of scanning a layout netlist of the integrated circuit may comprise scanning devices in the plurality of memory cells and in the plurality of non-memory cells to identify a first MOS transistor having a source/drain region electrically connected to an electrode of a storage capacitor. This identification at least preliminarily confirms the MOS transistor as an access transistor of a DRAM bit cell. Subsequent local tracing operations about and around the identifiable characteristic can then be performed to confirm the identity of the memory bit cell. Additional bit cells may also be identified by "globally" tracing a bit line (connected to the other source/drain of the access transistor) and/or word line (connected to the gate of the access transistor) to see if other devices connected thereto also possess the identifiable characteristic associated with a DRAM bit cell. These global tracing operations may conclude with the identification of a block of memory cells with the bit lines and word lines constituting input pins thereto.

Still further operations to determine equivalency between an integrated circuit schematic and an integrated circuit layout containing a plurality of memory blocks therein arranged hierarchically using parent and child layout cells, may include translating word line and bit line connections from a first memory block within a child layout cell into a higher level parent layout cell containing the child layout cell. As described above with respect to FIGS. 28, 29A–29B and 30A–30B, operations may also be performed to scan a layout netlist of the parent layout cell to identify a first device therein that has an identifiable characteristic associated with a plurality of memory cells relative to a plurality of non-memory cells within the integrated circuit layout. A layout netlist of a first memory cell containing the first device is then traced to identify a first bit line or a first word line therein that is electrically coupled to the first memory cell. This tracing operation may then continue with an operation to trace the first bit line and/or the first word line to identify a transistor level memory block within the parent layout cell. A preferred operation may then be performed to combine the transistor level memory block with the first memory block that was translated from the child cell to the parent cell. These operations to determine equivalency may also include identifying a plurality of memory blocks defined by a respective plurality of child layout cells contained within a parent layout cell, using a depth-first search operation that identifies respective bit line and word line connections to the memory blocks. The identified plurality of memory blocks may then be combined with the transistor level memory block within the parent layout cell.

Figure 31:
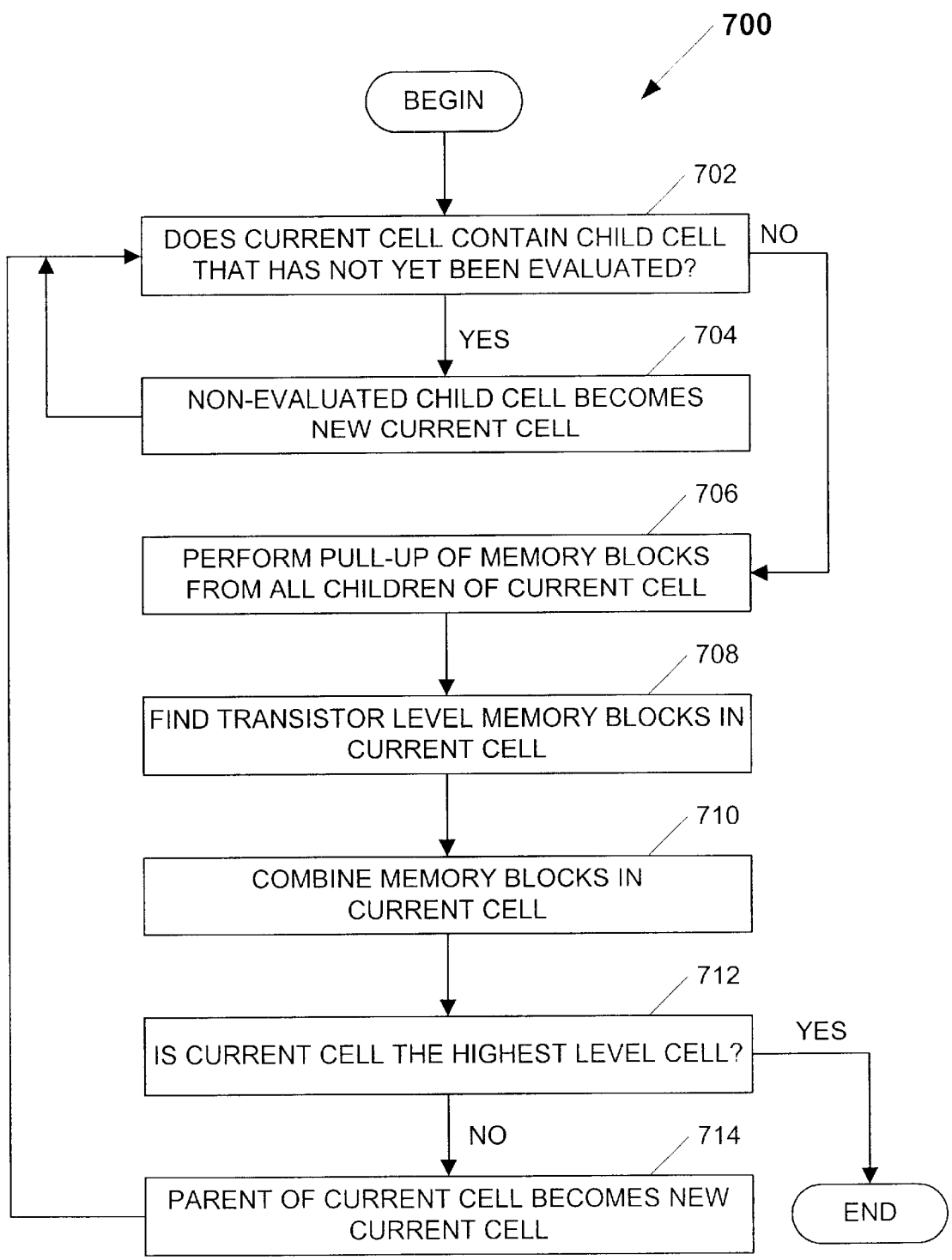
FIG. 31 is a flow diagram that illustrates operations performed in determining equivalency between an integrated circuit schematic and an integrated circuit layout containing memory cells.
Figure 32:
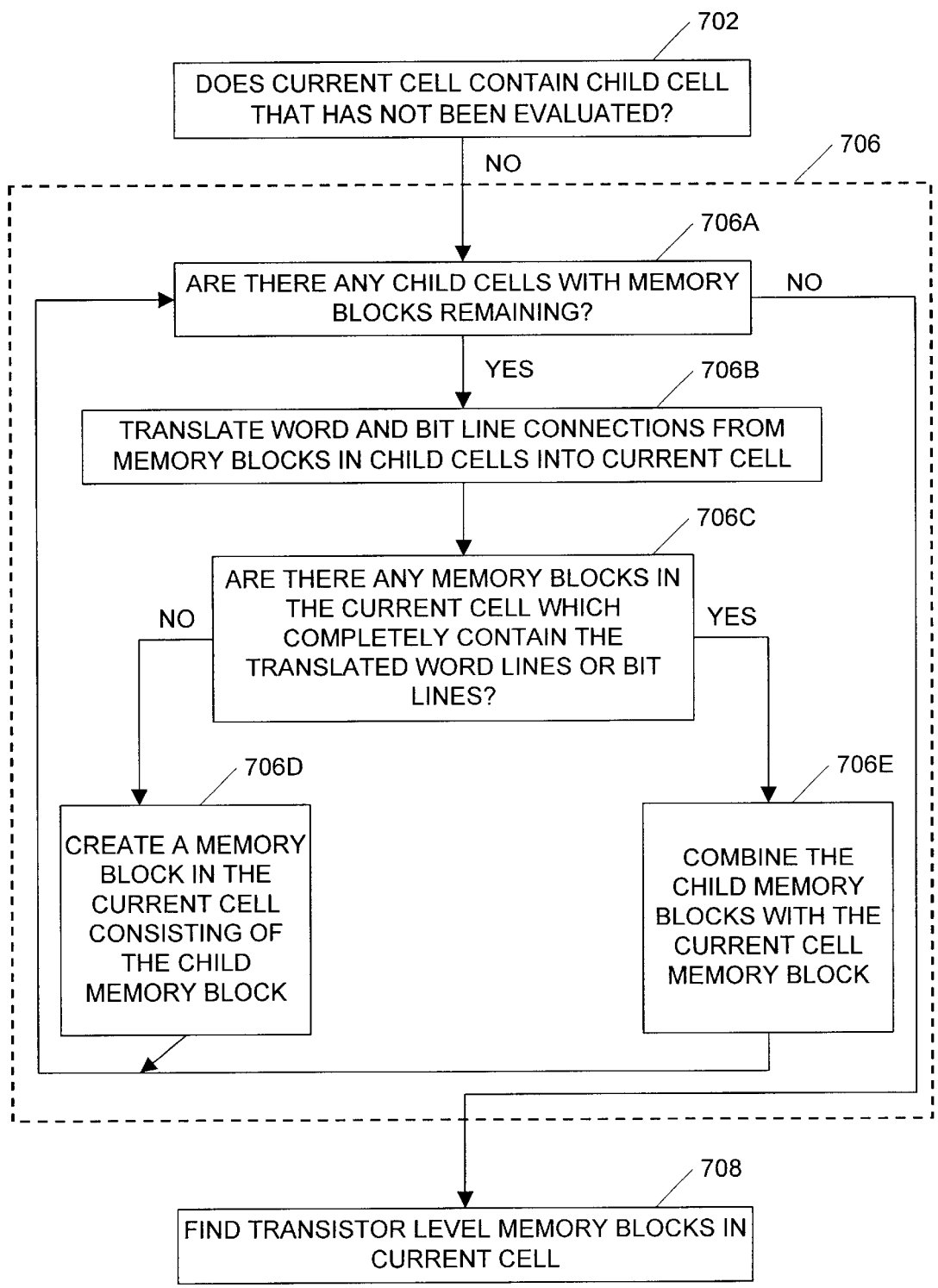
FIG. 32 is a flow diagram that illustrates in more detail operations performed by Block 708 in FIG. 31.

In particular, FIGS. 31–32 illustrate preferred operations 700 that can be used in methods to determine equivalency between an integrated circuit schematic and an integrated circuit layout containing a plurality of memory blocks therein that are arranged hierarchically using parent and child layout cells. The operations illustrated by FIGS. 31–32 illustrate a depth first search technique that can identify bit line and word line connections to user-defined memory blocks and also identify and combine transistor level memory blocks with the user-defined memory blocks. Referring now to FIG. 31, preferred operations 700 include a check to determine whether a current cell within a hierarchical layout netlist contains a child cell that has not been evaluated, Block 702. This current cell may initially constitute a highest level cell of a layout of an integrated circuit memory device. If the current cell being evaluated does contain a non-evaluated child cell, then the non-evaluated child cell becomes the new current cell, Block 704, and the operation of Block 702 is repeated. Once a determination is made that the current cell does not contain any non-evaluated child cells, control is passed to Block 706. Preferred operations are then performed to pull-up memory blocks from all child cells that may be within the current cell, Block 706, and also find any transistor level memory blocks that may be in the current cell. Block 708. The operation 708 to find transistor level memory blocks within the current cell is preferably performed in accordance with the operations illustrated by FIGS. 28, 29A–29B and 30A–30B. As illustrated by Block 710, an operation is then performed to combine (i) the memory blocks that have been pulled up from any and all child cells and (ii) any user-defined memory blocks within the current cell and (iii) any transistor level memory blocks that have been identified by performing the operations of Block 708. A check may then be made to determine whether the current cell is the highest level cell. If the current cell is the highest level cell, then the operations illustrated by FIGS. 31–32 are terminated. If, on the other hand, the current cell is not the highest level cell, then the parent of the current cell becomes the new current cell, Block 714, and control is passed back to Block 702.

Referring now to FIG. 32, preferred operations to perform pull-up of memory blocks within a current cell, Block 706, will now be described. As illustrated by Block 706A, a check is made to determine whether there are any child cells with memory blocks within the current cell. If there are, then word line and bit line connections from a memory block within a child cell are translated into the current cell, Block 706B. A check is then made to determine whether there are any memory blocks in the current cell that completely contain the translated word lines and bit lines, Block 706C. If yes, then the memory block(s) from within the child cell (i.e., the memory block having the translated bit line and word line connections) is combined with the memory block within the current cell, Block 706E. If not, then a memory block is created within the current cell, Block 706D, and this created memory block corresponds to the memory block having the translated bit line and word line connections. Control is then passed back to Block 706A where another check is made to determine whether there are any child cells with memory blocks remaining. If not, then control is passed to Block 708 illustrated by FIG. 31.

As an example, the operations illustrated by FIGS. 31–32 will now be described with respect to an integrated circuit layout that comprises a 16×16 array of memory cells. At the parent level, this 16×16 array may be comprised of first and second "child" cells and a first user-undefined transistor level memory array connected to word lines WL8–15 and bit lines BL0–7. The first child cell comprises a user undefined transistor level memory array connected to word lines WL0–7 and bit lines BL4–7 and a third cell. This third cell (grandchild cell) comprises a user defined memory block connected to word lines WL0–7 and bit lines BL0–3. The second child cell comprises a second user defined memory block connected to word lines WL0–15 and bit lines BL8–15. This hierarchical arrangement of a 16×16 memory array containing parent, child and grandchild cells is illustrated by FIG. 33.

Figure 33:
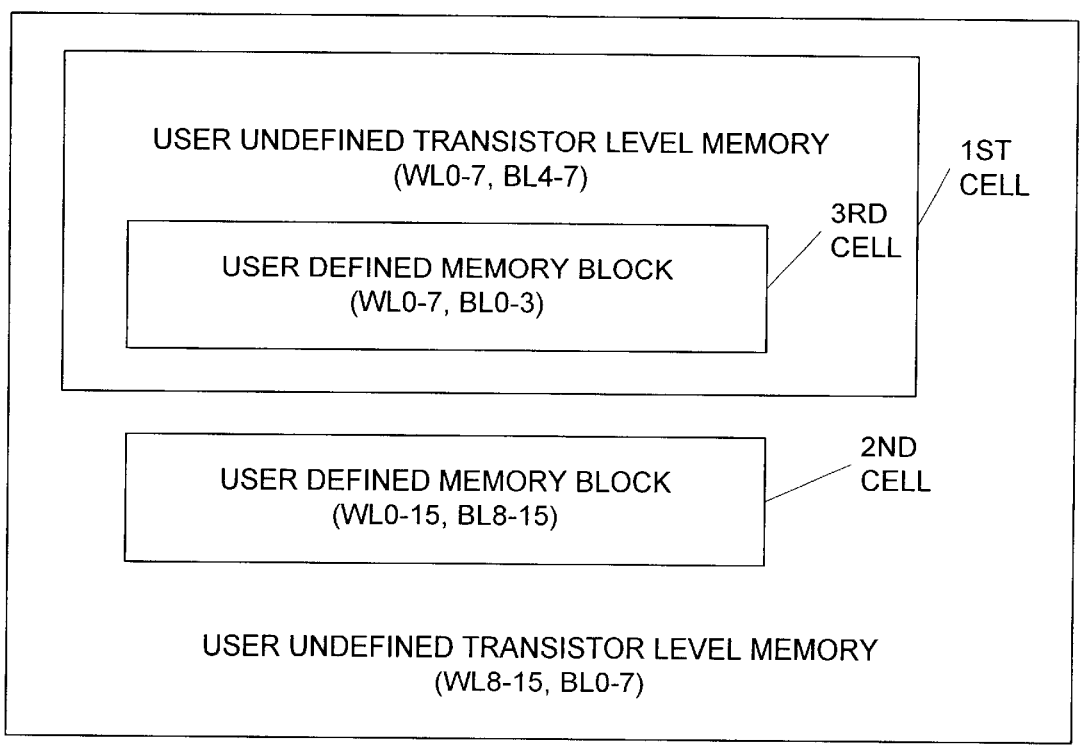
FIG. 33 is block diagram that illustrates the hierarchical arrangement of an exemplary memory array.

Referring now to FIGS. 31–33, a check is made at Block 702 as to whether the current cell (i.e., the highest level cell) contains any child cells that have not yet been evaluated. Because the first cell and second cell have not been evaluated, one of the first and second cells is selected first as the new current cell, Block 704. Assuming for purposes of illustration that the first cell is selected, a check is then made at Block 702 to determine whether the first cell contains any child cells that have not been evaluated. Since the first cell contains a third cell (grandchild cell) that has not been evaluated, the third cell becomes the new current cell at Block 704. Because the third cell does not itself contain any child cells, control is passed from Block 702 to Block 706. At Block 706, any memory blocks within children of the third cell are "pulled up" into the third cell. In particular, at Block 706A, a check is made as to whether there are any child cells with memory blocks remaining However, because the third cell contains no child cells at all, control is passed to Block 708. Operations are then performed at Block 708 to find user undefined transistor level memory blocks within the third cell, however, because the third cell contains no transistor level memory blocks, the operations of Block 708 are bypassed along with the operations of Block 710 since there are no pulled-up or transistor level memory blocks to combine. A check is then made at Block 712 as to whether the third cell is the highest level cell. Because it is not, the first cell becomes the new current cell at Block 714 and control is passed back to Block 702. A check is then made at Block 702 as to whether the first cell contains any non-evaluated child cells. Because it does not, control is passed to Block 706. As illustrated by FIG. 32, a check is then made at Block 706A as to whether the first cell contains any child cells having memory blocks. Since the third cell does contain a user defined memory block, control is passed to Block 706B. At Block 706B, an operation is performed to translate the word and bit line connections (WL0–7, BL0–3) from the third cell to the first cell. At Block 706C, a check is then made to determine whether there are any memory blocks within the current cell which completely contain the translated word lines or bit lines. Since there are none in the current cell at this point, the operation of Block 706D is performed and the memory block originally defined within the third cell is "pulled-up" and created as a memory block within the first cell.

Because there are no more child cells within the first cell, control is passed to Block 708 and an operation to identify transistor level memory blocks within the first cell is performed. Here, the operations illustrated by FIGS. 28, 29A–29B and 30A–30B may be performed by Block 708 to identify transistor level memory blocks at a given level of hierarchy. Accordingly, the first cell is identified as including a user-undefined transistor level memory (WL0–7, BL4–7). In Block 710, the memory block pulled up from the third cell is combined with the identified transistor level memory block in the first cell. This combination results in the formation of a combined memory block spanning word lines WL0–7 and bit lines BL0–7. As illustrated by Blocks 712 and 714, a check is made as to whether the current cell (i.e., the first cell) is the highest level cell. Because it is not, the next higher level cell (i.e., the top level cell) becomes the current cell, Block 714, and control is passed back to Block 702. Repeated performance of the operations of Blocks 702 and 704 identifies the second cell as a child cell that has not yet been evaluated. Control is then passed to Block 706. Because the second cell does not have any child cells or user-undefined transistor level memory blocks therein, the operations of Blocks 706, 708 and 710 do not result in a modification of the second cell. A check is then made at Block 712 as to whether the second cell is the highest level cell. Because it is not, the top level cell becomes the current cell, Block 714, and then a check is made at Block 702 to determine whether there are any child cells within the top level cell that have not been evaluated. Because none exist at this point in the operations, control is again passed to Block 706.

Pull-up operations are then performed on the first and second cells at Block 708. As illustrated in detail by FIG. 32, these pull-up operations will result in the creation of one memory block spanning word lines WL0–7 and bit lines WL0–7 and another memory block spanning word lines WL0–15 and bit lines BL8–15. Control is then passed to the operations of Block 708 which seek to find transistor level memory blocks in the top level cell. In particular, the operations described above with respect to FIGS. 28, 29A–29B and 30A–30B may be performed to identify the user-undefined transistor level memory within the highest level cell and create another memory block spanning word lines 8–15 and bit lines BL0–7. Next, an operation is performed at Block 710 to combine the three resulting memory blocks within the highest level cell as a 16×16 array of memory cells (e.g., SRAM, DRAM, etc.). The operations are then completed when Block 712 identifies the current cell as the highest level cell.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of determining equivalency between an integrated circuit schematic and an integrated circuit layout containing a plurality of memory cells and a plurality of non-memory cells therein, comprising the steps of:

scanning a layout netlist of the integrated circuit to identify a first device therein that has an identifiable characteristic associated with the plurality of memory cells relative to the plurality of non-memory cells;

tracing a layout netlist of a first memory cell containing the first device to identify a first bit line or a first word line therein that is electrically coupled to the first memory cell; and tracing the first bit line and/or the first word line to identify a plurality of memory cells electrically coupled thereto.

2. The method of claim 1, further comprising the step of determining correspondence between the integrated circuit schematic and the integrated circuit layout by treating the plurality of memory cells as part of a child cell and treating the first bit line or the first word line as an input pin of the child cell.

3. The method of claim 1, wherein said step of tracing a layout netlist of a first memory cell comprises tracing a netlist path extending from the first device to a first bit line or a first word line electrically connected to the first memory cell.

4. The method of claim 1, wherein said step of tracing the first bit line or the first word line comprises the steps of:
tracing a first word line electrically coupled to the first memory cell to identify a first row of memory cells; and
tracing a second bit line electrically coupled to a second memory cell in the first row of memory cells to identify a first column of memory cells.

5. The method of claim 1, wherein said step of tracing the first bit line or the first word line comprises the steps of:
tracing a first word line electrically coupled to the first memory cell to identify a first row of memory cells; and
then tracing the first bit line electrically coupled to the first memory cell to identify a first column of memory cells.

6. The method of claim 5, further comprising the step of determining correspondence between the integrated circuit schematic and the integrated circuit layout by treating the plurality of memory cells as a child cell and treating the first word line and the first bit line as pins of the child cell.

7. The method of claim 1, wherein the plurality of memory cells comprise SRAM cells; and wherein said step of scanning a layout netlist of the integrated circuit comprises scanning devices in the plurality of memory cells and in the plurality of non-memory cells to identify a first field effect transistor having a gate electrode electrically connected to a source/drain region of a second field effect transistor.

8. The method of claim 7, wherein said step of scanning a layout netlist of the integrated circuit comprises scanning the second field effect transistor to determine if a gate electrode of the second field effect transistor is electrically connected to a source/drain region of the first field effect transistor.

9. The method of claim 1, wherein the plurality of memory cells comprise DRAM cells; and wherein said step of scanning a layout netlist of the integrated circuit comprises scanning devices in the plurality of memory cells and in the plurality of non-memory cells to identify a first access transistor having a source/drain region electrically connected to an electrode of a storage capacitor.

10. A method of determining equivalency between an integrated circuit schematic and an integrated circuit layout containing a plurality of memory blocks therein arranged hierarchically using parent and child layout cells, comprising the steps of:
translating word line and bit line connections from a first memory block within a child layout cell into a parent layout cell containing the child layout cell;
scanning a layout netlist of the parent layout cell to identify a first device therein that has an identifiable characteristic associated with a plurality of memory cells relative to a plurality of non-memory cells within the integrated circuit layout;
tracing a layout netlist of a first memory cell containing the first device to identify a first bit line or a first word line therein that is electrically coupled to the first memory cell;
tracing the first bit line and/or the first word line to identify a transistor level memory block within the parent layout cell; and combining the transistor level memory block with the first memory block.

11. A method of determining equivalency between an integrated circuit schematic and an integrated circuit layout containing a plurality of memory blocks therein arranged hierarchically using parent and child layout cells, comprising the steps of:
identifying a plurality of memory blocks defined by a respective plurality of child layout cells contained within a parent layout cell, using a depth first search operation that identifies bit line and word line connections to the memory blocks;
scanning a layout netlist of the parent layout cell to identify a first device therein that has an identifiable characteristic associated with a plurality of memory cells relative to a plurality of non-memory cells within the integrated circuit layout;
tracing a layout netlist of a first memory cell containing the first device to identify a first bit line or a first word line therein that is electrically coupled to the first memory cell;
tracing the first bit line and/or the first word line to identify a transistor level memory block within the parent layout cell; and
combining the identified plurality of memory blocks with the transistor level memory block within the parent layout cell.

12. A method of performing layout versus schematic comparison of an integrated circuit memory device, comprising the steps of:
coloring a schematic graph of an integrated circuit to obtain a first set of net colors for a first plurality of nets in the schematic graph;
assigning a color to a first net in the first plurality of nets that is connected to a first pin of a memory block within the integrated circuit; and
recoloring the first set of net colors by determining a new color for the first net using a net coloring operation that is a function of the assigned color, a color of the memory block and a color of each of the first plurality of nets that are electrically connected to pins of the memory block that are independently swappable with the first pin, but is independent of a color symmetrizing matrix.

13. The method of claim 12, wherein the first net is a bit line; wherein the integrated circuit includes a column decoder that is electrically connected to the first net; and wherein the assigned color is unique to the other colors in the first set.

14. The method of claim 12, wherein the first net is a bit line; wherein the integrated circuit includes a column decoder that is electrically connected to the first net; and wherein said recoloring step comprises the steps of:
determining effective colors associated with each of the pins of the memory block using the net coloring operation; and
determining a new color for the first net based on the effective colors of each of the pins in the memory block that are connected to the first net.

15. The method of claim 14, wherein said step of determining a new color for the first net comprises determining a sum of the effective colors of each of the pins in the memory block that are connected to the first net.

16. The method of claim 12, wherein the first net is a bit line; wherein the integrated circuit includes a column decoder that is electrically connected to the first net; wherein the memory block has input pins that are independently swappable with each other and input pins that are dependently swappable with each other; and wherein said step of determining a new color for the first net using a net coloring operation comprises determining a new color for the first pin using a coloring operation that is a function of a color of the memory block and a color of each of the pins of the memory block that are independently swappable with the first pin but is independent of a color of any of the pins of the memory block that are dependently swappable with the first pin.

17. A method of determining equivalency between an integrated circuit schematic and an integrated circuit layout containing a plurality of memory blocks therein arranged hierarchically using parent and child layout cells, comprising the steps of:

identifying a plurality of memory blocks defined by a respective plurality of child layout cells contained within a parent layout cell, using a depth first search operation that identifies bit line and word line connections to the memory blocks;

combining the identified plurality of memory blocks together into a M×N memory block in the integrated circuit layout, where M and N are integers;

coloring a layout graph of the integrated circuit layout to obtain a first set of net colors for a first plurality of nets in the layout graph;

assigning a color to a first net in the first plurality of nets that is connected to a first pin of the M×N memory block; and recoloring the first set of net colors by determining a new color for the first net using a net coloring operation that is a function of the assigned color, a color of the M×N memory block and a color of each of the first plurality of nets that are electrically connected to pins of the M×N memory block that are independently swappable with the first pin.

18. A method of determining equivalency between an integrated circuit schematic and an integrated circuit layout containing a plurality of memory blocks therein arranged hierarchically using parent and child layout cells, comprising the steps of:

identifying a plurality of user-defined memory blocks defined by a respective plurality of child layout cells contained within a parent layout cell, using a depth first search operation that identifies bit line and word line connections to the memory blocks;

scanning a netlist of at least a portion of the integrated circuit layout to identify a transistor level memory block therein; and combining the identified plurality of memory blocks and the transistor level memory block within the parent layout cell.

19. A computer program product that determines equivalency between an integrated circuit schematic and an integrated circuit layout containing a plurality of memory cells and a plurality of non-memory cells therein, and comprises a computer-readable storage medium having computer-readable program code embodied in said medium, said computer-readable program code comprising:

computer-readable program code that scans a layout netlist of the integrated circuit to identify a first device therein that has an identifiable characteristic associated with the plurality of memory cells relative to the plurality of non-memory cells;

computer-readable program code that traces a layout netlist of a first memory cell containing the first device to identify a first bit line or a first word line therein that is electrically coupled to the first memory cell; and computer-readable program code that traces the first bit line and/or the first word line to identify a plurality of memory cells electrically coupled thereto.

20. A computer program product that determines equivalency between an integrated circuit schematic and an integrated circuit layout containing a plurality of memory blocks therein arranged hierarchically using parent and child layout cells, and comprises a computer-readable storage medium having computer-readable program code embodied in said medium, said computer-readable program code comprising:

computer-readable program code that identifies a plurality of user-defined memory blocks defined by a respective plurality of child layout cells contained within a parent layout cell, using a depth first search operation that identifies bit line and word line connections to the memory blocks;

computer-readable program code that scans a netlist of at least a portion of the integrated circuit layout to identify a transistor level memory block therein; and computer-readable program code that combines the identified plurality of memory blocks and the transistor level memory block within the parent layout cell.

* * * * *